US009989586B2

(12) United States Patent
Liu et al.

(10) Patent No.: US 9,989,586 B2
(45) Date of Patent: Jun. 5, 2018

(54) CONVERTER CIRCUIT AND OPEN-CIRCUIT DETECTION METHOD OF THE SAME

(71) Applicant: Delta Electronics (Shanghai) Co., Ltd., Shanghai (CN)

(72) Inventors: Liang Liu, Shanghai (CN); Bo-Yu Pu, Shanghai (CN); Yi Zhang, Shanghai (CN); Hong-Jian Gan, Shanghai (CN); Jian-Ping Ying, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 422 days.

(21) Appl. No.: 14/682,122

(22) Filed: Apr. 9, 2015

(65) Prior Publication Data
US 2015/0346276 A1    Dec. 3, 2015

(30) Foreign Application Priority Data

May 30, 2014 (CN) .......................... 2014 1 0239308

(51) Int. Cl.
*G01R 31/3187* (2006.01)
*G01R 31/28* (2006.01)
(Continued)

(52) U.S. Cl.
CPC ..... *G01R 31/2884* (2013.01); *G01R 31/2853* (2013.01); *H02M 7/487* (2013.01); *G01R 31/026* (2013.01); *H02M 1/32* (2013.01)

(58) Field of Classification Search
CPC ............ G01R 31/2884; G01R 31/2853; G01R 31/026; H02M 7/487; H02M 1/32
(Continued)

(56) References Cited

U.S. PATENT DOCUMENTS 4,300,085 A * 11/1981 Monma ................ H02H 7/0844
                                                318/490
5,617,012 A *  4/1997 Murakami ............... H02H 7/12
                                                323/207
(Continued)

FOREIGN PATENT DOCUMENTS

CN         1617434 A      5/2005
CN       101505106 A      8/2009
(Continued)

OTHER PUBLICATIONS

Soon et al., A simple Open-Circuit Fault Detection Method for a Fault-Tolerant DC/DC Converter, Jul. 2015, Conference Paper, researchgate.net.*

(Continued)

*Primary Examiner* — Jermele M Hollington
*Assistant Examiner* — Sean Curtis
(74) *Attorney, Agent, or Firm* — CKC & Partners Co., Ltd.

(57) ABSTRACT

A converter circuit is provided. The converter circuit includes a capacitor module, bridge arms, a voltage measuring module and an open-circuit detection module. Each bridge arm is connected to the capacitor module in parallel and includes an upper arm and a lower bridge arm connected at a middle point. The voltage measuring module measures voltage differences between each two bridge arms. The open-circuit detection module transmits test impulse signals to the bridge arms to activate at least one upper-conducted bridge arm and at least one lower-conducted bridge arm. The open-circuit detection module retrieves the voltage differences of each pair of the upper-conducted and lower-conducted bridge arms to make comparison with a reference value to determine an operation state thereof, and makes comparison of the operation state determined according to the different groups of test impulse signals to determine (Continued)

whether the upper and the lower bridge arms are actually open circuit.

28 Claims, 11 Drawing Sheets

(51) Int. Cl.
*H02M 7/487* (2007.01)
*G01R 31/02* (2006.01)
*H02M 1/32* (2007.01)

(58) Field of Classification Search
USPC .................................................... 324/750.3
See application file for complete search history.

(56) References Cited

U.S. PATENT DOCUMENTS

| | | | | |
|---|---|---|---|---|
| 5,942,982 A * | 8/1999 | Noble | ................ | G01R 31/3181 324/500 |
| 5,977,774 A * | 11/1999 | Noble | ................ | G01R 31/3004 324/523 |
| 6,011,708 A * | 1/2000 | Doht | ................. | H02M 7/53871 363/132 |
| 6,058,031 A * | 5/2000 | Lyons | ................... | H02M 7/487 363/132 |
| 6,134,128 A * | 10/2000 | Enzensberger | ....... | B60L 3/0023 363/51 |
| 6,999,326 B2 * | 2/2006 | Eckardt | ............. | H02M 7/53875 318/400.26 |
| 8,040,096 B2 * | 10/2011 | Taniguchi | ............... | H02M 1/32 318/490 |
| 8,633,664 B2 * | 1/2014 | Endoh | ..................... | H02M 1/32 318/400.21 |
| 9,479,071 B2 * | 10/2016 | Shi | ..................... | H02M 3/33569 |
| 9,515,576 B2 * | 12/2016 | Yuan | ................... | H02M 7/5387 |
| 2004/0165404 A1 * | 8/2004 | Eckardt | ............. | H02M 7/53875 363/17 |
| 2009/0096394 A1 * | 4/2009 | Taniguchi | ............... | H02M 1/32 318/400.09 |
| 2010/0277956 A1 * | 11/2010 | Kurokawa | ........ | H02M 3/33507 363/21.04 |
| 2010/0295521 A1 * | 11/2010 | Odaohhara | ............... | G06F 1/26 323/282 |
| 2011/0248657 A1 * | 10/2011 | Endoh | .................. | B62D 5/0487 318/400.22 |
| 2013/0083571 A1 * | 4/2013 | Pu | ........................ | H02M 1/126 363/44 |
| 2015/0039151 A1 * | 2/2015 | Yumura | .............. | B60L 11/1861 700/297 |
| 2015/0256106 A1 * | 9/2015 | Yuan | ................... | H02M 7/5387 363/132 |
| 2015/0270789 A1 * | 9/2015 | Shi | ..................... | H02M 3/33569 363/65 |
| 2015/0346276 A1 * | 12/2015 | Liu | ....................... | H02M 7/487 324/750.3 |
| 2015/0357935 A1 * | 12/2015 | Ding | .................. | H03K 17/0828 363/131 |
| 2015/0380926 A1 * | 12/2015 | Zhong | ..................... | H02M 1/32 363/56.01 |
| 2016/0049867 A1 * | 2/2016 | Liu | ........................ | H02M 3/157 363/39 |
| 2016/0146875 A1 * | 5/2016 | Rajczewski | ........ | G01R 19/0092 324/118 |
| 2016/0365787 A1 * | 12/2016 | Geske | ....................... | H01T 1/14 |
| 2017/0034887 A1 * | 2/2017 | Ichikawa | .................. | B60Q 1/04 |

FOREIGN PATENT DOCUMENTS

| | | | | |
|---|---|---|---|---|
| CN | 102053210 A | * | 5/2011 | |
| CN | 103001187 A | | 3/2013 | |
| CN | 103235219 | | 8/2013 | |
| CN | 103364683 A | | 10/2013 | |
| CN | 103424648 A | | 12/2013 | |
| CN | 103728514 A | * | 4/2014 | |
| CN | 103760496 A | * | 4/2014 | |
| CN | 103869208 A | * | 6/2014 | |
| CN | 103986310 A | * | 8/2014 | ............ H02M 7/487 |
| CN | 104843553 A | * | 8/2015 | |
| CN | 105226975 A | * | 1/2016 | ......... H03K 17/0828 |
| CN | 103424648 B | * | 8/2016 | |
| EP | 2164161 A2 | | 3/2010 | |
| TW | I398657 B | | 6/2013 | |
| WO | WO 2015172810 A1 | * | 11/2015 | .............. H02M 1/32 |

OTHER PUBLICATIONS

Adam et al., Half- and Full-Bridge Modular Multilevel Converter Models for Simulations of Full-Scale HVDC Links and Multiterminal DC Grids,IEEE Journal of Emerging and Selected Topics in Power Electronics, vol. 2, No. 4, Dec. 2014.*

Salimian et al. ,Open-Circuit Fault Detection and Localization in Modular Multilevel Converter,The 6th International Power Electronics Drive Systems and Technologies Conference (PEDSTC2015) Feb. 3-4, 2015, Shahid Beheshti University, Tehran, Iran.*

Li et al., An IGBT Open-Circuit Fault Detection Method for Modular Multilevel Converters,9th International Conference on Power Electronics—ECCE Asia, Jun. 1-5, 2015 / 63 Convention Center, Seoul, Korea.*

Brunson et al.,Open-Circuit Fault Detection and Diagnosis in Matrix Converters, IEEE Transactions on Power Electronics, vol. 30, No. 5, May 2015.*

Sen et al., Open Circuit Fault Detection and Localization in Modular Multilevel Converter, IEEE 2016.*

K.-B. Lee and J.-S. Lee, "Chapter 2-Open-Circuit Fault Detection Methods for Three-Level Converters" in Reliability Improvement Technology for Power Converters, Power Systems, DOI, © Springer Nature Singapore Pte Ltd. 2017.*

Jae-Chul Lee et al., "A Control Method for Improvement of Reliability in Fault Tolerant NPC Inverter System", Power Electronics Specialists Conference, 2006, PESC' 06 37th IEEE, Jun. 18-22, 2006.

* cited by examiner

| FAILURE | CONDITION | FAILURE | CONDITION |
| --- | --- | --- | --- |
| SW1 Failure | UBA120 Open | SW1, SW3, SW12 Failure | UBA/LBA 120, 121 and 125 Open |
| SW1, SW2 Failure | UBA120 Open | SW1, SW3 Failure | UBA/LBA120 and 121 Open |
| SW3 Failure | LBA121 Open | SW3, SW6 Failure | UBA/LBA121 and 122 Open |
| SW4 Failure | LBA121 Open | SW6, SW9 Failure | UBA122 and 124 Open |
| SW5 Failure | UBA122 Open | SW4, SW6 Failure | UBA/LBA121 and 122 Open |
| SW6 Failure | UBA122 Open | SW7, SW9 Failure | UBA/LBA123 and 124 Open |
| SW7 Failure | LBA123 Open | SW7, SW12 Failure | LBA123 and 125 Open |
| SW8 Failure | LBA123 Open | SW6, SW12 Failure | UBA/LBA122 and 125 Open |
| SW9 Failure | UBA124 Open | SW2, SW3 Reverse | UBA/LBA120 and 121 Open |
| SW10 Failure | UBA124 Open | SW4, SW5 Reverse | UBA/LBA121 and 122 Open |
| SW11 Failure | LBA125 Open | SW6, SW7 Reverse | UBA/LBA122 and 123 Open |
| SW12 Failure | LBA125 Open | SW8, SW9 Reverse | UBA/LBA123 and 124 Open |
| SW1, SW12 Failure | UBA/LBA120 and 125 Open | SW10, SW11 Reverse | UBA/LBA124 and 125 Open |

FIG. 3

CONVERTER CIRCUIT AND OPEN-CIRCUIT DETECTION METHOD OF THE SAME

RELATED APPLICATIONS

This application claims priority to China Application Serial Number 201410239308.1, filed May 30, 2014, which is herein incorporated by reference.

BACKGROUND

Field of Invention

The present invention relates to a converter technology. More particularly, the present invention relates to a converter circuit and the open-circuit detection method of the same.

Description of Related Art

Since the converter is widely used in the power system, the requirements on its maintainability requirements hence are increasing accordingly. The multilevel converter, for example, which provides a lot of convenience on applications of high voltage and high power occasions, but with the level number increases, the number of switches required for the main circuit doubles, the circuit structure and control scheme become more complex, leads to malfunction of the power electronic device increasing, and the reliability of the system greatly reducing.

Currently the malfunctions that commonly occur include open-circuit or open-circuit malfunctions of the power semiconductor switches, and malfunctions such as wire disconnection, wrong connection, or driver errors which causes damages to the devices and systems. If there is no effective mechanism to detect if the converter circuit is under open-circuit malfunction, the converter circuit can easily be damaged during operations, resulting in stoppage of the production, or even seriously accidents.

Hence it is an important issue to design a new converter circuit and an open-circuit detection method thereof to solve the aforementioned problem.

SUMMARY

Therefore an aspect of the present disclosure is to provide a converter circuit. The converter circuit includes a capacitor module, a plurality of bridge arms, a voltage measuring module and an open-circuit detection module. Each of the bridge arms electrically connects to the capacitor module in parallel and comprises an upper bridge arm having at least one upper-half power semiconductor switch and a lower bridge arm having at least one lower-half semiconductor switch, respectively, wherein the upper bridge arm and the lower bridge arm electrically connect in series at a middle point. The voltage measuring module is used for electrically connecting to the middle points of the bridge arms, to measure each voltage difference between each two bridge arms. The open-circuit detection module transmits a plurality sets of testing impulse signals to the upper-half power semiconductor switches and the lower-half power semiconductor switches of the bridge arms, to make at least one of the bridge arms become a upper-conducted bridge arm which is the bridge arm only with a conducted upper bridge arm under a normal operation, and to make and at least one of the bridge arms become a lower-conducted bridge arm which is the bridge arm only with a conducted lower bridge arm under the normal operation. Wherein the open-circuit detection module gets the voltage differences of each pair of the upper-conducted and lower-conducted bridge arms from the voltage measuring module, to make comparison with a reference value for generating a comparison result accordingly, and to each pair of the upper-conducted and lower-conducted bridge arms, to further determine operation states of the conducted upper bridge arm and of the conducted lower bridge arm under the normal operation. The open-circuit detection module further makes comparisons between the operation states determined according to the different sets of the testing impulse signals, to further determine if the upper and lower bridge arms of the bridge arms are actually open circuit.

Another aspect of the present disclosure is to provide an open-circuit detection method of a converter circuit, for testing if a converter circuit having an open-circuit condition, wherein the converter circuit comprises a capacitor module, a plurality of bridge arms, a voltage measuring module, and an open-circuit detection module. Each of the bridge arms electrically connects to the capacitor module in parallel and comprises an upper bridge arm having at least one upper-half power semiconductor switch and a lower bridge arm having at least one lower-half semiconductor switch, respectively, wherein the upper bridge arm and the lower bridge arm electrically connect in series at a middle point. The open-circuit detection method of the converter circuit includes: transmitting a plurality sets of testing impulse signals to the upper-half power semiconductor switches and the lower-half power semiconductor switches of the bridge arms, to make at least one of the bridge arms become a upper-conducted bridge arm which is the bridge arm only with a conducted upper bridge arm under a normal operation and at least one of the bridge arms become a lower-conducted bridge arm which is the bridge arm only with a conducted lower bridge arm under the normal operation; measuring each voltage difference between each two bridge arms by the voltage measuring module electrically connecting to the middle points of the bridge arms; getting the voltage differences of each pair of the upper-conducted and lower-conducted bridge arms from the voltage measuring module by the open-circuit detection module, to make comparison with a reference value for generating a comparison result accordingly, and to each pair of the upper-conducted and lower-conducted arms, to further determine operation states of the conducted upper bridge arm and of the conducted lower bridge arm under the normal operation; and making comparisons between the operation states determined according to the different sets of the testing impulse signals by the open-circuit detection module, to further determine if the upper and lower bridge arms of each of the bridge arms are actually open circuit.

Further another aspect of the present disclosure is to provide a converter circuit. The converter circuit includes a capacitor module, a plurality of bridge arms, a voltage measuring module and an open-circuit detection module. The capacitor module has a capacitive upper bridge arm with at least a first capacitor and a capacitive lower bridge arm with at least a second capacitor, wherein the capacitive upper bridge arm and the capacitive lower bridge arm electrically connect at a capacitive middle point; each of the bridge arms electrically connects to the capacitor module in parallel and comprises a upper bridge arm having at least one upper-half power semiconductor switch and a lower bridge arm having at least one lower-half semiconductor switch, respectively, wherein the upper bridge arm and the lower bridge arm electrically connect in series at a middle point; a voltage measuring module electrically connects to the middle points of the bridge arms and the capacitive middle point, to measure voltage differences between the capacitor module and one of the bridge arms. The open-circuit detection module transmits a plurality set of testing impulse signals to the upper-half power semiconductor switches and the lower-half power semiconductor switches of the bridge arms, to make at least one of the bridge arms become a upper-conducted bridge arm which is the bridge arm only with a conducted upper bridge arm under a normal operation or to make at least one of the bridge arms become a lower-conducted bridge arm which is the bridge arm only with a conducted lower bridge arm under the normal operation. Wherein the open-circuit detection module gets the voltage difference between the capacitor module and the upper-conducted bridge arm or the voltage difference between the capacitor module and the lower-conducted arm from the voltage measuring module, to make comparison with a reference value for generating a comparison result accordingly, and to the upper-conducted bridge arm or to the lower-conducted arm, to further determine an operation state of the ought-to-be conducted upper bridge arm or of the ought-to-be conducted lower bridge arm under the normal operation.

Further another aspect of the present disclosure is to provide an open-circuit detection method of a converter circuit, for testing if a converter circuit having an open-circuit condition, wherein the converter circuit comprises a capacitor module, a plurality of bridge arms, a voltage measuring module, and an open-circuit detection module. The capacitor module has a capacitive upper bridge arm with at least a first capacitor and a capacitive lower bridge arm with at least a second capacitor, wherein the capacitive upper bridge arm and the capacitive lower bridge arm electrically connect at a capacitive middle point; each of the bridge arms electrically connects to the capacitor module in parallel and comprises a upper bridge arm having at least one upper-half power semiconductor switch and a lower bridge arm having at least one lower-half semiconductor switch, respectively, wherein the upper bridge arm and the lower bridge arm electrically connect in series at a middle point; the open-circuit detection method of the converter circuit includes: transmitting a plurality sets of testing impulse signals to the upper-half power semiconductor switches and the lower-half power semiconductor switches of the bridge arms, to make one of the bridge arms become a upper-conducted bridge arm which is the only bridge arm with a conducted upper bridge arm under a normal operation, or to make one of the bridge arms become a lower-conducted bridge arm which is the only bridge arm with a conducted lower bridge arm under the normal operation; measuring voltage differences between the capacitor module and one of the bridge arms by the voltage measuring module electrically connecting to the capacitive middle point and the middle points of the bridge arms; and getting the voltage difference between the capacitor module and the upper-conducted bridge arm or the voltage difference between the capacitor module and the lower-conducted arm from the voltage measuring module by the open-circuit detection module, to make comparison with a reference value for generating a comparison result accordingly, and to the upper-conducted bridge arm or to the lower-conducted arm, to further determine an operation state of the ought-to-be conducted upper bridge arm or of the ought-to-be conducted lower bridge arm under the normal operation.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows:

FIG. 3 is a comparison table of the failure reasons of each of the bridge arms and the caused open-circuit conditions;

DETAILED DESCRIPTION

Figure 1:
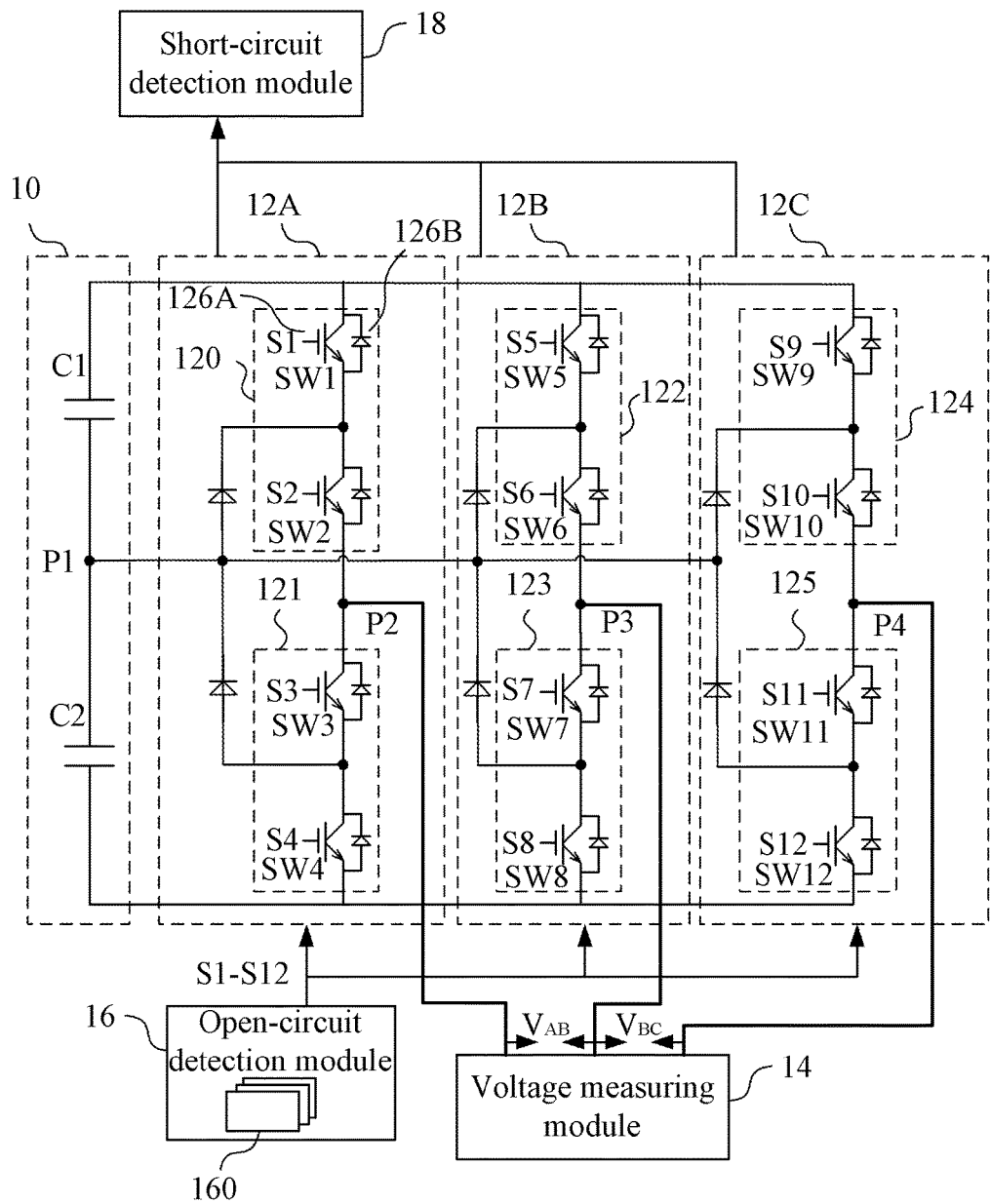
FIG. 1 is a circuit diagram of a converter circuit 1 according to an exemplary embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

Please refer to FIG. 1. FIG. 1 is a circuit diagram of a converter circuit 1 according to an exemplary embodiment of the present disclosure. The converter circuit 1 includes a capacitor module 10, bridge arms 12A, 12B, 12C, a voltage measuring module 14 and an open-circuit detection module 16.

In an exemplary embodiment, the capacitor module 10 may include a first capacitor C1 and a second capacitor C2 electrically connect in series via the middle point P1. In an exemplary embodiment, the capacitor module 10 connect to other external circuit (not shown), such as, but not limited to a rectifier circuit via a bus (not shown).

In this exemplary embodiment, the converter circuit 1 includes three bridge arms 12A, 12B, and 12C, wherein each of the bridge arms 12A, 12B, and 12C connect to the capacitor module 10 in parallel, respectively, and each of the bridge arms 12A, 12B, and 12C is three level. In other exemplary embodiments, the converter circuit 1 can be realized by the two-level converter circuit, which includes three bridge arms, each connects to the capacitor module in parallel, or the converter circuit 1 can be realized by the multi-level converter circuit, which includes three bridge arms, each connects to the capacitor module in parallel. In other exemplary embodiments, the number of the voltage levels of the converter can vary according to different design requirements, and the number of the voltage levels of the converter is not restricted by the present disclosure.

In an exemplary embodiment, the bridge arms 12A, 12B, and 12C, can have the same structures. Taking the bridge arm 12A as an example, the bridge arms 12A includes a upper bridge arm 120 and a lower bridge arm 121 which electrically connect at the middle point P2. Similarly, the bridge arm 12B includes a upper bridge arm 122 and a lower bridge arm 123 which electrically connect at the middle point P3. The bridge arm 12C includes an upper bridge arm 124 and a lower bridge arm 125 which electrically connect at the middle point P4.

In an exemplary embodiment, the upper bridge arms 120, 122, 124 and the lower bridge arms 121, 123, 125 included by the bridge arms 12A, 12B, and 12C can have the same structures. In an exemplary embodiment, the converter circuit 1 can be a three level converter, hence, taking the upper bridge arm 120 and the lower bridge arm 121 within the bridge arm 12A as an example, the upper bridge arm 120 includes upper-half power semiconductor switches SW1 and SW2 which electrically connect with each other, and the lower bridge arm 121 includes lower-half power semiconductor switches SW3 and SW4 which electrically connect to each other in series.

Likewise the upper bridge arm 122 of the bridge arm 12B includes upper-half power semiconductor switches SW5 and SW6 which electrically connect to each other in series, and the lower bridge arm 123 includes the lower-half power semiconductor switches SW7 and SW8 which electrically connect to each other in series. The upper bridge arm 124 of the bridge arms 12C includes upper-half power semiconductor switches SW9 and SW10 which electrically connect to each other in series, and the lower bridge arm 125 includes the lower-half power semiconductor switches SW11 and SW12 which electrically connect to each other in series.

In an exemplary embodiment, the upper-half and lower-half power semiconductor switches SW1-SW12 have the same structures. Taking the upper-half power semiconductor switch SW1 for example, it includes an Insulated Gate Bipolar Transistor (IGBT) 126A. In some exemplary embodiments, the upper-half power semiconductor switch SW1 includes the IGBT 126A and a diode 126B which electrically connect to each other in parallel, in other exemplary embodiments, the upper-half and lower-half power semiconductor switches SW1-SW12 can be realized by other structures, and are not restricted by the present disclosure.

Please note that, in other exemplary embodiments, taking the upper-half power semiconductor switches SW1 for the example, the number of which can be plural, and the upper-half power semiconductor switches SW1 can connect to each other in series, in parallel or series-parallel. Similarly, the number of the upper-half power semiconductor switches SW2, SW5, SW6, SW9 and SW10, the number of the lower-half power semiconductor switches SW3, SW4, SW7, SW8, SW11 and SW12 can be plural, and the construction manner of which are alike that of the upper-half power semiconductor switches SW1.

The voltage measuring module 14 electrically connect at the middle points P2, P3, and P4 of the bridge arms 12A, 12B, and 12C, to measure the voltage differences between every two bridge arms. In an exemplary embodiment, the voltage measuring module 14 can only measure the voltage difference $V_{AB}$ between the bridge arms 12A and 12B, and the voltage difference $V_{BC}$ between the bridge arms 12B and 12C. Thus, the voltage difference $V_{AC}$ between the bridge arms 12A and 12C can be derived from calculations of the voltage difference $V_{AB}$ and the voltage difference $V_{BC}$. In an exemplary embodiment, the voltage measuring module 14 can measure the voltage difference $V_{AB}$ between the bridge arms 12A and 12B, the voltage difference $V_{BC}$ between the bridge arms 12B and 12C, and the voltage difference $V_{AC}$ between the bridge arms 12A and 12C, respectively.

The open-circuit detection module 16 transmits a plurality sets of testing impulse signals to the upper-half power semiconductor switches and lower-half power semiconductor switches SW1-SW12 of the bridge arms 12A-12C. On FIG. 1, a set of the testing impulse signals S1-S12 transmitting to the bridge arms 12A-12C is illustrated. Wherein the testing impulse signals S1-S12 corresponding to the upper-half and lower-half power semiconductor switches SW1-SW12, respectively. In an exemplary embodiment, the testing impulse signals S1-S12 transmit to the gates of the IGBTs (such as IGBT 126A) included by each of the upper-half and lower-half power semiconductor switches SW1-SW12, to hence control the turning-on and turning-off, to thereby control the on/off of the upper and lower bridge arms 120-125.

The plurality sets of the testing impulse signals transmitted by the open-circuit detection module 16, are used to make at least one of the bridge arms 12A-12C to become the upper-conducted bridge arm which is the only bridge arm with a conducted upper bridge arm under the normal operation, and at least one of the bridge arms 12A-12C become a lower-conducted bridge arm which is the only bridge arm with a conducted lower bridge arm under the normal operation.

Figure 2A:
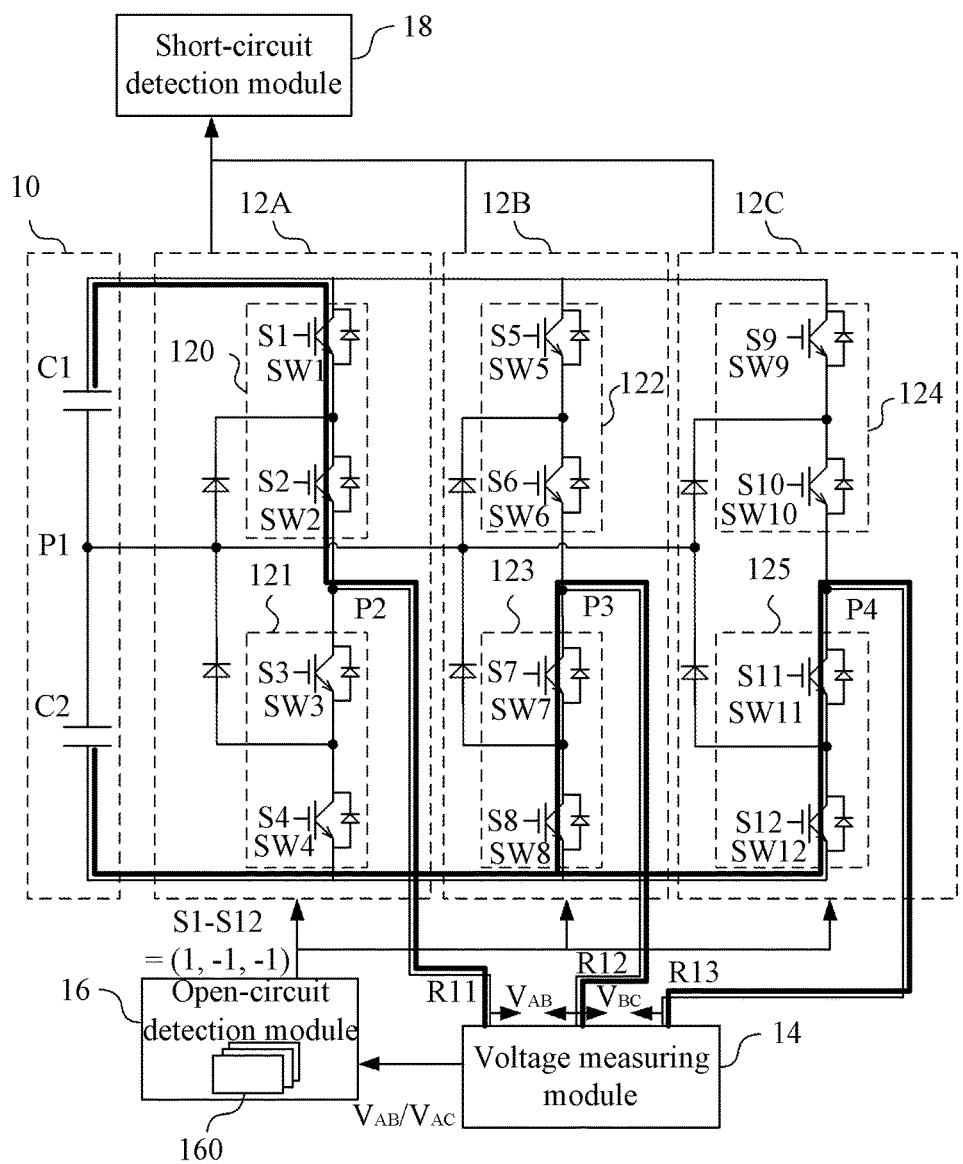
FIG. 2A-FIG. 2F are the circuit diagrams of the converter circuit according to an exemplary embodiment of the present disclosure, respectively.

Please refer to FIG. 2A. FIG. 2A is the circuit diagram of the converter circuit 1 according to an exemplary embodiment of the present disclosure.

When the testing impulse signals S1-S4 are (1, 1, 0, 0), the bridge arms 12A serves as the upper-conducted bridge arm. The testing impulse signals S1-S2 will make the upper bridge arm 120 which include the upper-half power semiconductor switches SW1-SW2 to be turned-on (active) under the normal operation. And the testing impulse signals S3-S4 will make the lower bridge arm 121 which include the lower-half power semiconductor switches SW3-SW4 to be off under the normal operation. At this time, the set (1, 1, 0, 0) of the testing impulse signals S1-S4 can be shorted as 1.

When the testing impulse signals S5-S8 are (0, 0, 1, 1), the bridge arm 12B is used as the lower-conducted arm. The testing impulse signals S5-S6 will make the upper bridge arm 122 having the upper-half power semiconductor switches SW5-SW6 to be off under the normal operation. The testing impulse signals S7-S8 will make the lower bridge arm 123 with the lower-half power semiconductor switches SW7-SW8 are on (active) under the normal operation. The set (0, 0, 1, 1) of the testing impulse signals S5-S8 can be shorten as −1.

When the testing impulse signals are S9-S12 (0, 0, 1, 1), the bridge arms 12C is used as the lower-conducted arm. The testing impulse signals S9-S10 will make the upper bridge arm 124 having the upper-half power semiconductor switches SW9-SW10 to be off under the under the normal operation, and the testing impulse signals S11-S12 will make the lower bridge arm 125 having the lower-half power semiconductor switches SW11-SW12 to be on(active) under the normal operation. The set (0, 0, 1, 1) of the testing impulse signals S9-S12 can be shorted as −1.

Thus, when the set of the testing impulse signals S1-S12 is (1, 1, 0, 0, 0, 0, 1, 1, 0, 0, 1, 1), that is the shorten (1, −1, −1), the bridge arm 12A hence is the upper-conducted bridge arm, and the bridge arms 12B and 12C are the lower-conducted arms, respectively. The bridge arms 12A, 12B, 12C under the normal operation will make the converter circuit 1 to form passages R11, R12, and R13. Wherein the passage R11 is a way from the capacitor C1 to the voltage measuring module 14 via the upper bridge arm 120. The passage R12 is a way from the capacitor C2 to the voltage measuring module 14 via the lower bridge arm 123. The passage R13 is a way from the capacitor C2 to the voltage measuring module 14 via the lower bridge arm 125.

The open-circuit detection module 16 gets the voltage differences of each pair of the upper-conducted and lower-conducted bridge arms from the voltage measuring module 14. In this exemplary embodiment, the open-circuit detection module 16 gets the voltage difference $V_{AB}$ between the bridge arms 12A and 12B, and the voltage difference $V_{AC}$ between the bridge arms 12A and 12C.

The open-circuit detection module 16 further compare the voltage differences $V_{AB}$, $V_{AC}$ with the reference value, to generate a comparison result accordingly. In an exemplary embodiment, the reference value is generated according to the calculations of the cross voltage $V_{dc}$ (not shown) of the capacitor module 10 by the open-circuit detection module 16, for instance, but is not limited to, to multiply the cross voltage $V_{dc}$ of the capacitor module 10 by a coefficient to get the reference value. According to the comparison result, the open-circuit detection module 16 can determined the operation states of the conducted upper bridge arm 120 and conducted lower bridge arms 123, 125.

For example, when both the voltage differences $V_{AB}$ and $V_{AC}$ are equal to the reference value, the open-circuit detection module 16 determines that both the upper bridge arm 120 and the lower bridge arms 123, 125 are under the normal state, therefore the voltage measuring module 14 can get the voltage difference $V_{AB}$ equal to the reference value via the passage R11, and the passage R12, and get the voltage difference $V_{AC}$ equal to the reference value via the passages R11, R13.

When the voltage difference $V_{AB}$ is equal to the reference value, and the voltage difference $V_{AC}$ is different from the reference value, the open-circuit detection module 16 determines that the upper bridge arm 120 and the lower bridge arm 123 are under the normal state, and the lower bridge arm 125 is under the open-circuit failure state, thus making the voltage measuring module 14 get the voltage difference $V_{AB}$ equal to the reference via the passages R11 and R12. In addition, since the lower bridge arm 125 is open circuit, the passage R13 can not be established successfully, therefore the voltage difference $V_{AC}$ got by the voltage measuring module 14 will be different from the reference value.

When the voltage difference $V_{AB}$ is different from the reference value, and the voltage difference $V_{AC}$ is equal to the reference value, the open-circuit detection module 16 determines the upper bridge arm 120 and the lower bridge arm 125 are under the normal state, and the lower bridge arm 123 is under the open-circuit failure state, thus making the voltage measuring module 14 get the voltage difference $V_{AC}$ equal to the reference voltage via the passages R11 and R13. And, since the lower bridge arm 123 is under the open circuit, thus it is fail to establish the passage R12, the voltage difference $V_{AB}$ got by the voltage measuring module 14 therefore is different from the reference value.

When both the voltage difference $V_{AB}$ and the voltage difference $V_{AC}$ are different from the reference value, it may be caused by the situation that the upper bridge arm 120 is normal while the lower bridge arms 123, 125 are open circuit, or by the situation that no matter the lower bridge arms 123, 125 are normal or not, the upper bridge arm 120 is open circuit. Therefore, the open-circuit detection module 16 can not exactly know the situations of the upper bridge arm 120 and the lower bridge arms 123, 125, thereby determines the upper bridge arm 120 and the lower bridge arm 125 are under the potential open-circuit failure state. It is to be noted that the potential open-circuit failure state means at least one of the upper bridge arm 120, the lower bridge arm 123 and the lower bridge arm 125 is under the open-circuit failure state.

Please noted that, the "equal" between the reference value and the aforementioned voltage differences $V_{AB}$ and $V_{AC}$ is not restricted to be exactly the same, it is allowed to have a reasonable error range.

Therefore, after the open-circuit detection module 16 transmits the testing impulse signals S1-S12 (1, −1, −1), it can further gets the voltage difference $V_{AB}$ and the voltage difference $V_{AC}$ according to the voltage measuring module 14, and compares the voltage differences with the reference value, for determining the operation states of the upper bridge arm 120 and the lower bridge arms 123 and 125.

Figure 2B:
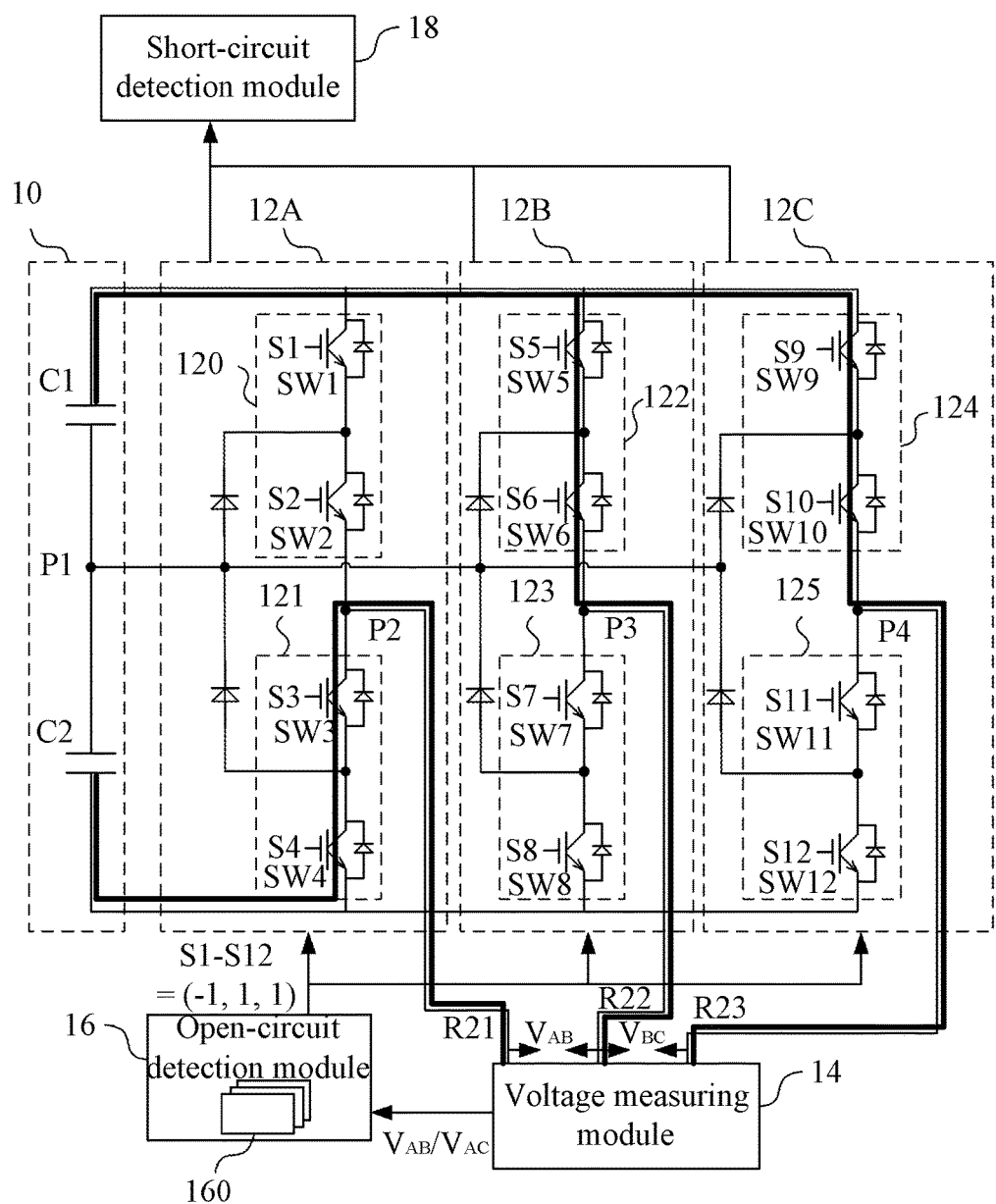

Please refer to FIG. 2B. FIG. 2B is a circuit diagram of the converter circuit 1 according to an exemplary embodiment.

Similarly, the open-circuit detection module 16 can transmit a set (−1, 1, 1) of testing impulse signals S1-S12, to make the bridge arm 12A be the lower-conducted arm, and the bridge arms 12B, 12C as the upper-conducted bridge arm. That is, the upper bridge arm 120 within the bridge arm 12A is off under the normal operation, and the lower bridge arm 121 is conducted under the normal operation. The upper bridge arm 122 within the bridge arm 12B is conducted under the normal operation, and the lower bridge arm 123 is off under the normal operation. The upper bridge arm 124 within the bridge arm 12C is conducted under the normal operation, and the lower bridge arm 125 is off under the normal operation.

The bridge arms 12A, 12B, and 12C under the normal operation will make the converter circuit 1 form the passages R21, R22 and R23. Wherein, the passage R21 is a way from the capacitor C2 to the voltage measuring module 14 via the lower bridge arm 121. The passage R22 is a way from the capacitor C1 to the voltage measuring module 14 via the upper bridge arm 122. Passage R23 is a way from the capacitor C1 to the voltage measuring module 14 via the upper bridge arm 124.

The open-circuit detection module 16 gets the voltage differences of each pair of the upper-conducted and lower-conducted bridge arms from the voltage measuring module 14. In this exemplary embodiment, the open-circuit detection module 16 gets the voltage difference $V_{AB}$ between the bridge arms 12A and 12B, and the voltage difference $V_{AC}$ between the bridge arms 12A and 12C, and the same as the aforementioned manner in the exemplary embodiment illustrated in FIG. 2A, to further compare with the reference value, and according to the comparison result, the open-circuit detection module 16 determines the operation states of the conducted lower bridge arm 121 and the conducted upper bridge arms 122, and 124. For example, when both the voltage differences $V_{AB}$ and $V_{AC}$ are equal to the reference value, the open-circuit detection module 16 determines that both the lower bridge arm 121 and the upper bridge arms 122, 124 are under the normal state, therefore the voltage measuring module 14 can get the voltage difference $V_{AB}$ equal to the reference value via the passages R21 and R22, and get the voltage difference $V_{AC}$ equal to the reference value via the passages R21, R23.

When the voltage difference $V_{AB}$ is equal to the reference value, and the voltage difference $V_{AC}$ is different from the reference value, the open-circuit detection module 16 determines that the lower bridge arm 121 and the upper bridge arm 122 are under the normal state, and the upper bridge arm 124 is under the open-circuit failure state, thus making the voltage measuring module 14 get the voltage difference $V_{AB}$ equal to the reference via the passages R21 and R22. In addition, since the upper bridge arm 124 is open circuit thus making the passage R23 is not established successfully, the voltage difference $V_{AC}$ got by the voltage measuring module 14 will be different from the reference value.

When the voltage difference $V_{AB}$ is different from the reference value, and the voltage difference $V_{AC}$ is equal to the reference value, the open-circuit detection module 16 determines the lower bridge arm 121 and the upper bridge arm 124 are under the normal state, and the upper bridge arm 122 is under the open-circuit failure state, thus making the voltage measuring module 14 get the voltage difference $V_{AC}$ equal to the reference voltage via the passages R21 and R23. And, since the upper bridge arm 122 is under the open circuit, thus it is fail to establish the passage R22, the voltage difference $V_{AB}$ got by the voltage measuring module 14 therefore is different from the reference value.

When the voltage difference $V_{AB}$ and the voltage difference $V_{AC}$ are different from the reference value, it may be caused by the situation that the lower bridge arm 121 is normal while the upper bridge arms 122, 124 are open circuit, or by the situation that no matter the upper bridge arms 122, 124 are normal or not, the lower bridge arm 121 is open circuit. Therefore, the open-circuit detection module 16 can not exactly know the situations of the lower bridge arm 121 and the upper bridge arms 122, 124, thereby determines the lower bridge arm 121 and the upper bridge arm 124 are under the potential open-circuit failure state. It is to be noted that the potential open-circuit failure state means at least one of the lower bridge arm 121, the upper bridge arm 122 and the upper bridge arm 124 is under the open-circuit failure state.

Figure 2C:
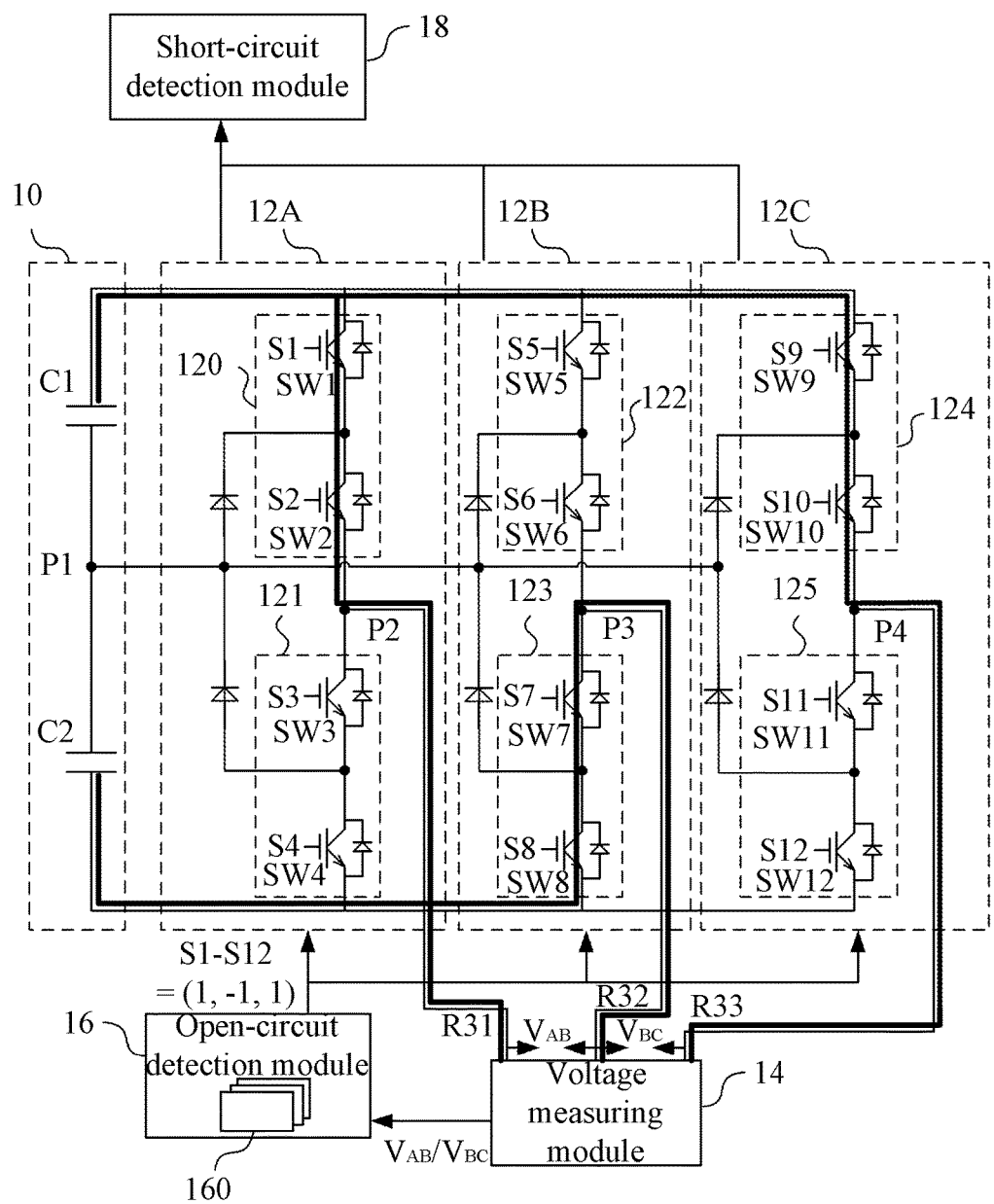

FIG. 2C is a circuit diagram of the converter circuit 1 according to an exemplary embodiment.

Likewise, the open-circuit detection module 16 can transmits a set (1, −1, 1) of the testing impulse signals S1-S12, to make the bridge arms 12A, 12C be the upper-conducted bridge arms and the bridge arm 12B to be the lower-conducted arm. That is, the upper bridge arms 120, 124 within the bridge arms 12A, 12C are conducted under the normal operation, and the lower bridge arms 121, 125 are off under the normal operation. The upper bridge arm 122 within the bridge arm 12B is off under the normal operation, and the lower bridge arm 123 is conducted under the normal operation.

The bridge arms 12A, 12B, and 12C under the normal operation will make the converter circuit 1 forms the passages R31, R32 and R33. Wherein the passage R31 is a path from the capacitor C1 to the voltage measuring module 14 via the upper bridge arm 120. The passage R32 is a way from the capacitor C2 to the voltage measuring module 14 via the lower bridge arm 123 voltage measuring module 14. The passage R33 is a way from the capacitor C1 to the voltage measuring module 14 via the upper bridge arm 124.

The open-circuit detection module 16 gets the voltage differences of each pair of the upper-conducted and lower-conducted bridge arms from the voltage measuring module 14. In this exemplary embodiment, the open-circuit detection module 16 gets the voltage difference $V_{AB}$ between the bridge arms 12A and 12B, and the voltage difference $V_{BC}$ between the bridge arms 12B and 12C, and the same as the aforementioned manner in the exemplary embodiment illustrated in FIG. 2A, to further compare with the reference value, and according to the comparison result, the open-circuit detection module 16 determines the operation states of the conducted upper bridge arms 120, 124 and the conducted lower bridge arm 123.

Figure 2D:
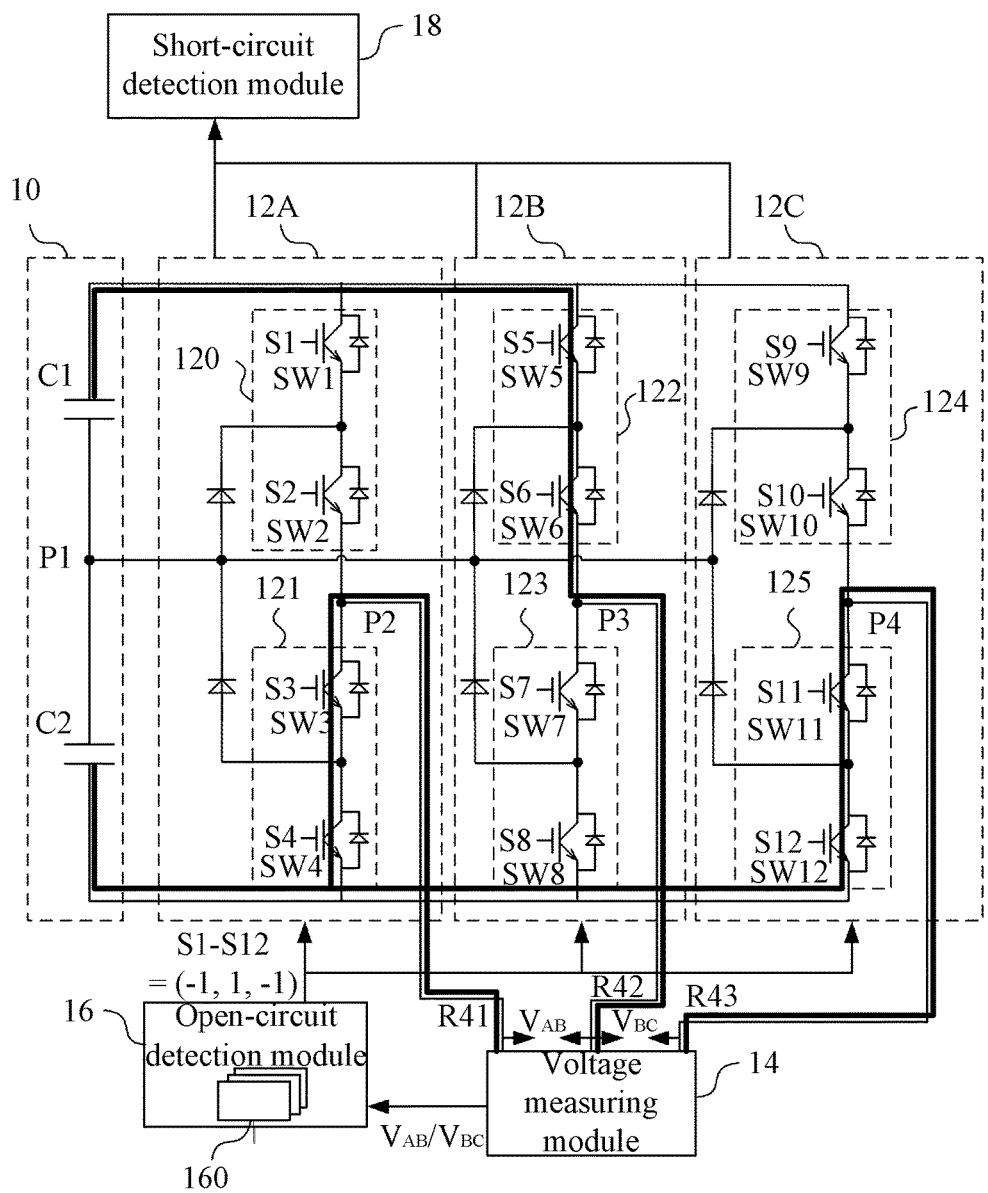

FIG. 2D is a circuit diagram of the converter circuit 1 according to an exemplary embodiment.

Likewise, the open-circuit detection module 16 can transmits a set (−1, 1, −1) of the testing impulse signals S1-S12, to make the bridge arm 12B be an upper-conducted bridge arm, and make the bridge arms 12A, 12C be the lower-conducted arm. That is, the upper bridge arm 122 within the bridge arm 12B is conducted under the normal operation, and the lower bridge arm 123 is off under the normal operation. The upper bridge arms 120, 124 within the bridge arms 12A, 12C are off under the normal operation, and the lower bridge arms 121, 125 are conducted under the normal operation.

The bridge arms 12A, 12B, and 12C under the normal operation will make the converter circuit 1 forms the passages R41, R42 and R43. Wherein, the passage R41 is a way from the capacitor C2 to the voltage measuring module 14 via the lower bridge arm 121. The passage R42 is a path from the capacitor C1 to the voltage measuring module 14 via the upper bridge arm 122. The passage R43 is a path from the capacitor C2 to the voltage measuring module 14 via the lower bridge arm 125.

The open-circuit detection module 16 gets the voltage differences of each pair of the upper-conducted and lower-conducted bridge arms from the voltage measuring module 14. In this exemplary embodiment, the open-circuit detection module 16 gets the voltage difference $V_{AB}$ between the bridge arms 12A and 12B, and the voltage difference $V_{BC}$ between the bridge arms 12B and 12C, and the same as the aforementioned manner in the exemplary embodiment illustrated in FIG. 2A, to further compare with the reference value, and according to the comparison result, the open-circuit detection module 16 determines the operation states of the conducted upper bridge arm 122 and the conducted lower bridge arms 121, 125.

Figure 2E:
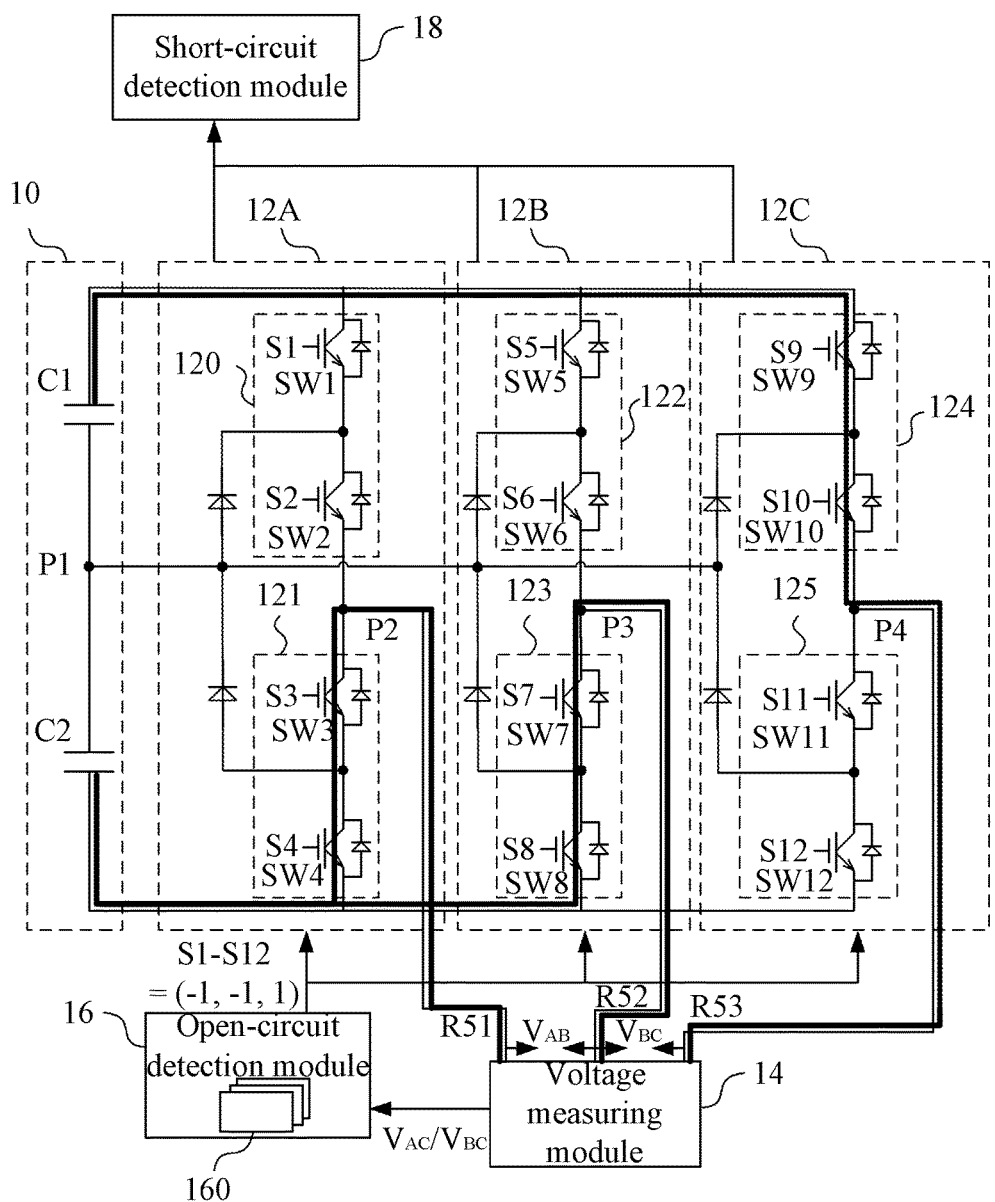

FIG. 2E is a circuit diagram of the converter circuit 1 according to an exemplary embodiment.

Likewise, the open-circuit detection module 16 can transmits a set (−1, −1, 1) of the testing impulse signals S1-S12, to make the bridge arm 12C be the upper-conducted bridge arm, and the bridge arms 12A, 12B to be the lower-conducted arms. That is, the upper bridge arm 124 within the bridge arm 12C is conducted under the normal operation, and the lower bridge arm 125 is off under the normal operation. The upper bridge arms 120, 122 within the bridge arms are off under the normal operation, and the lower bridge arm 121, 123 are conducted under the normal operation.

The bridge arms 12A, 12B, and 12C under the normal operation will make the converter circuit 1 form the passages R51, R52 and R53. Wherein the passage R51 is a way from the capacitor C2 to the voltage measuring module 14 via the lower bridge arm 121. The passage R52 is a way from the capacitor C2 to the voltage measuring module 14 via the lower bridge arm 123. The passage R53 is a path from the capacitor C1 to the voltage measuring module 14 via the upper bridge arm 124.

The open-circuit detection module 16 gets the voltage differences of each pair of the upper-conducted and lower-conducted bridge arms from the voltage measuring module 14. In this exemplary embodiment, the open-circuit detection module 16 gets the voltage difference $V_{AC}$ between the bridge arms 12A and 12C, and the voltage difference $V_{BC}$ between the bridge arms 12B and 12C, and the same as the aforementioned manner in the exemplary embodiment illustrated in FIG. 2A, to further compare with the reference value, and according to the comparison result, the open-circuit detection module 16 determines the operation states of the conducted upper bridge arm 124 and the conducted lower bridge arms 121, 123.

Figure 2F:
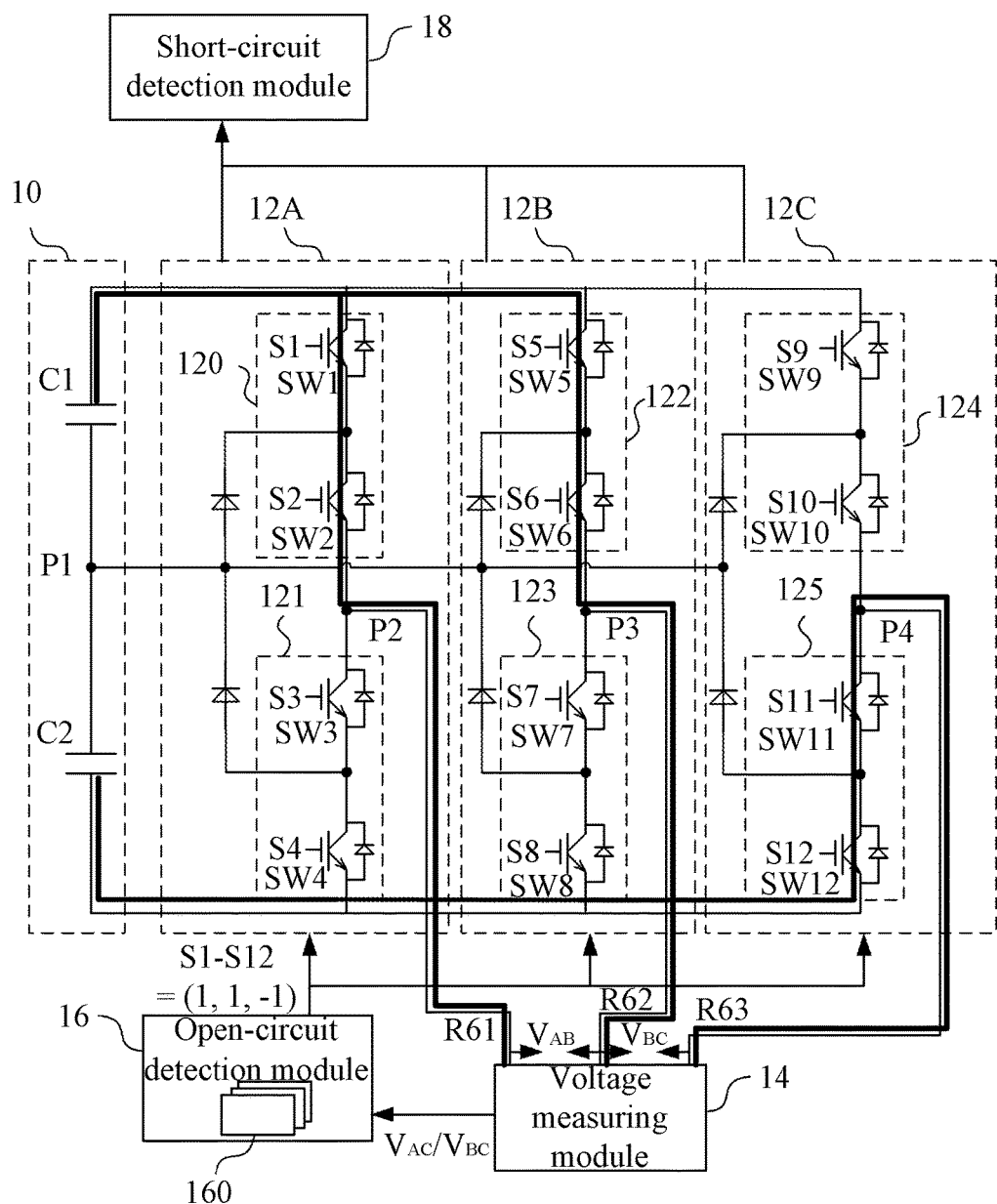

FIG. 2F is a circuit diagram of the converter circuit 1 according to an exemplary embodiment.

Likewise, the open-circuit detection module 16 can transmits a set (1, 1, −1) of the testing impulse signals S1-S12, to make the bridge arms 12A, 12B be the upper-conducted bridge arm, and the bridge arm 12C to be the lower-conducted arm. That is, the upper bridge arms 120, 122 within the bridge arms 12A, 12B are conducted under the normal operation, and the lower bridge arms 121, 123 are off under the normal operation. The upper bridge arm 124 within the bridge arm 12C is off under the normal operation, and the lower bridge arm 125 is conducted under the normal operation.

The bridge arms 12A, 12B, and 12C under the normal operation will make the converter circuit 1 forms the passages passage R61, R62 and R63. Wherein the passage R61 is a path from the capacitor C1 to the voltage measuring module 14 via the upper bridge arm 120. The passage R62 is a way from the capacitor C1 to the voltage measuring module 14 via the upper bridge arm 122. The passage R63 is a way from the capacitor C2 to the voltage measuring module 14 via the lower bridge arm 125.

The open-circuit detection module 16 gets the voltage differences of each pair of the upper-conducted and lower-conducted bridge arms from the voltage measuring module 14. In this exemplary embodiment, the open-circuit detection module 16 gets the voltage difference $V_{AC}$ between the bridge arms 12A and 12C, and the voltage difference $V_{BC}$ between the bridge arms 12B and 12C, and the same as the aforementioned manner in the exemplary embodiment illustrated in FIG. 2A, to further compare with the reference value, and according to the comparison result, the open-circuit detection module 16 determines the operation states of the conducted upper bridge arms 120, 122 and the conducted lower bridge arm 125.

In an exemplary embodiment, after the open-circuit detection module 16 transmits the aforementioned testing impulse signals S1-S12, it further stores a plurality of failure switch tables 160. In this exemplary embodiment, the open-circuit detection module 16 transmits the six sets (1, −1, −1), (−1, 1, 1), (1, −1, 1), (−1, 1, −1), (−1, −1, 1), (1, 1, −1) of testing impulse signals S1-S12 to the bridge arms 12A, 12B, and 12C one by one, and respectively generates six failure switch tables 160 according to the voltages between two bridge arms as measured one by one by the voltage measuring module 14. Each of the failure switch tables 160 records the operation states determined by each set of the testing impulse signals S1-S12 respectively, the operation states includes the aforementioned normal state, the open-circuit failure state and the potential open-circuit failure state. The open-circuit detection module 16 further executes summarization and analysis to the failure switch tables, by the comparison between the operation states determined by different sets of testing impulse signals S1-S12, the open-circuit detection module 16 further determines if each of the upper and lower bridge arms 120-125 of the bridge arms 12A, 12B, 12C is actually open circuit or not.

When the operation state of the upper bridge arm or lower bridge arm of one of the bridge arms 12A, 12 B, 12C is recorded as the open-circuit failure state in any one of the failure switch tables 160, the open-circuit detection module 16 determines the upper bridge arm or the lower bridge arm is actually open circuit.

When the operation state of the upper bridge arm or lower bridge arm of one of the bridge arms 12A, 12 B, 12C is not recorded as the open-circuit failure state in any one of the failure switch tables 160, and in at least one of the failure switch tables 160 is the normal state, the open-circuit detection module 16 determines the upper bridge arm or the lower bridge arm is actually normal.

And when the operation state of the upper bridge arm or lower bridge arm of one of the bridge arms 12A, 12 B, 12C is potential open-circuit failure state in all of the failure switch tables 160, the converter circuit 1 will execute the further determination by the cooperation of the short-circuit detection module 18 and the open-circuit detection module 16 within. First, the open-circuit detection module 16 transmits the conducting impulse signal to the bridge arm with a corresponding upper bridge arm or corresponding lower bridge arm under the potential open-circuit failure state, to make the upper bridge arm and the lower bridge arm of the aforementioned bridge arm are under the conducted state simultaneously. Then, the short-circuit detection module 18 detects the short-circuit failure state of the bridge arm, the open-circuit detection module 16 determines if the upper bridge arm or lower bridge arm is actually open circuit according to the short-circuit failure state.

For instance, when the upper bridge arm 120 of the first bridge arm 12A is under the potential open-circuit failure state, the open-circuit detection module 16 transmits a set of conducting impulse signal (1, 1) to the upper bridge arm 120 and the lower bridge arm 121, to make the upper-half power semiconductor switches SW1, SW2 of the upper bridge arm 120, and the lower-half power semiconductor switches SW3, SW4 of the lower bridge arm 121 under the conducted state; when the upper-half power semiconductor switches SW1, SW2 of the upper bridge arm 120 and the lower-half power semiconductor switches SW3, SW4 of the lower bridge arm 121 are under the normal operational state, the short-circuit detection module 18 will detect the short-circuit failure of the bridge arm 12A, the open-circuit detection module 16 hence further determines the upper bridge arm 120 is actually normal accordingly. In an exemplary embodiment, the short-circuit detection module 18 detects the short-circuit failure of the bridge arm 12A, it will output a short-circuit protecting signal (not shown), the open-circuit detection module 16 determines the upper bridge arm 120 is actually normal according to the received short-circuit protecting signal.

When both of the upper-half power semiconductor switches SW1, SW2 are open circuit, the short-circuit detection module 18 won't detect the short-circuit failure of the bridge arm 12A, the open-circuit detection module 16 will not receive the short-circuit protecting signal, hence will determine that the upper bridge arm 120 is actually open circuit.

Likewise, the lower bridge arm under the potential open-circuit failure state can be detected by the aforementioned manner, further description is omit here for the sake of brevity.

Please refer to FIG. 3. FIG. 3 is a comparison table of the failure reasons of the bridge arms 12A, 12B, 12C and the caused open-circuit conditions. In FIG. 3, the upper bridge arm is abbreviated as UBA, and the lower bridge arm is abbreviated as LBA.

The actually open circuit of each of the upper bridge arms or the lower bridge arms determined by the open-circuit detection module 16, in an exemplary embodiment, is caused by the open circuit of the upper-half power semiconductor switches within each upper bridge arm, or by the open circuit of the lower-half power semiconductor switches within the lower bridge arm. For example, when any one of the upper-half power semiconductor switches SW1, SW2 of the upper bridge arm 120 within the bridge arms 12A is open circuit, it will represent as the open-circuit condition of the upper bridge arm 120.

In some exemplary embodiments, the actually open circuit of each of the upper bridge arms or the lower bridge arms determined by the open-circuit detection module 16, in an exemplary embodiment, is caused by the polarity reverse of the signal wires or the reverse placement of the element itself between the different upper-half power semiconductor switches of the bridge arms 12A, 12B, 12C, or by the polarity reverse of the signal wires or the reverse placement of the element itself between the different lower-half power semiconductor switches of the bridge arms 12A, 12B, 12C, or by the polarity reverse of the signal wires or the reverse placement of the element itself of the upper-half power semiconductor switches and the lower-half power semiconductor switches within one of the bridge arms 12A, 12B, 12C.

For example, when the lower-half power semiconductor switch SW4 within the lower bridge arm 121 of the bridge arm 12A and the upper-half power semiconductor switch SW5 within the upper bridge arm 122 of the bridge arms 12B are with polarity reverse of the signal wires or the reverse placement of the elements itself, it represents as the open-circuit conditions of the lower bridge arm 121 and the upper bridge arm 122.

When the upper-half power semiconductor switch SW6 within the upper bridge arm 122 of the bridge arm 12B and the lower-half power semiconductor switch SW7 within the lower bridge arm 123 of the bridge arm 12B are with polarity reverse of the signal wires or the reverse placement of the elements itself, it represents as the open-circuit conditions of the upper bridge arm 122 and the lower bridge arm 123.

When the lower-half power semiconductor switch SW8 within the lower bridge arm 123 of the bridge arm 12B and the upper-haft power semiconductor switch SW9 within the upper bridge arm 124 of the bridge arm bridge arm 12C are with polarity reverse of the signal wires or the reverse placement of the elements itself, it represents as the open-circuit conditions of the lower bridge arm 123 and the upper bridge arm 124. When the upper-half power semiconductor switch SW10 within the upper bridge arm 124 of the bridge arm bridge arm 12C and the lower-half power semiconductor switch SW11 within the lower bridge arm 125 of the bridge arm 12C are with polarity reverse of the signal wires or the reverse placement of the elements itself, it represents as the open-circuit conditions of the upper bridge arm 124 and the lower bridge arm 125.

Therefore, by transmitting the testing impulse signals S1-S12, the present disclosure determines the operations of the upper-conducted arms and the lower-conducted arms according to the voltage differences between the upper-conducted arms and the lower-conducted arms of different bridge arms 12A, 12B, 12C, and compares the operation states determined according to different testing impulse signals S1-S12 to further determine if the bridge arms 12A, 12B, 12C are actually open circuit, to avoid the bridge arms 12A, 12B, 12C being damaged due to the open circuit under the operations.

Figure 4:
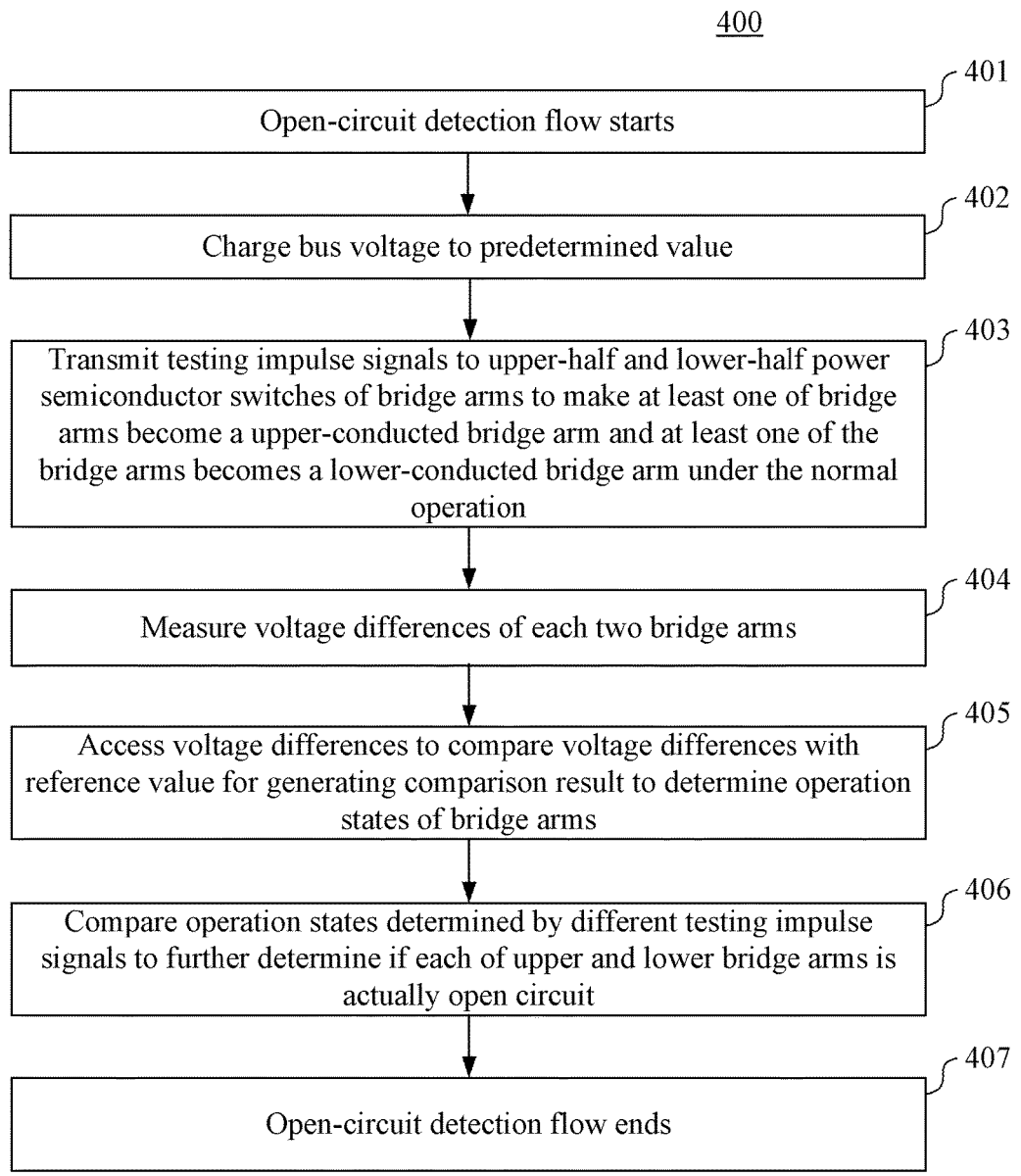
FIG. 4 is a flowchart of an open-circuit detection method of a converter circuit according to an exemplary embodiment of the present disclosure.

Please refer to FIG. 4. FIG. 4 is a flowchart of an open-circuit detection method 400 of a converter circuit according to an exemplary embodiment of the present disclosure. open-circuit detection method 400 of the converter circuit can be applied to the converter circuit 1 in FIG. 1. The open-circuit detection method 400 of the converter circuit includes the following steps. (Please notes that the order of the steps disclosed in this exemplary embodiment can vary, or some or all the steps can be executed at the same time, according to the actual requirements.)

In Step 401, the open-circuit detection flow starts.

In Step 402, make the bus voltage charges to the predetermined value, that is, make the cross voltage of the capacitor module equal to Vdc.

In Step 403, the open-circuit detection module 16 transmit the testing impulse signals S1-S12 to the upper-half and lower-half power semiconductor switches SW1-SW12 of the bridge arms 12A, 12B, 12C, to make at least one of the bridge arms 12A, 12B, 12C become a upper-conducted bridge arm which is the bridge arm only has a conducted upper bridge arm under the normal operation, and at least one of the bridge arms becomes a lower-conducted bridge arm which is the bridge arm only has a conducted lower bridge arm under the normal operation.

In Step 404, measure the voltage differences of each two bridge arms by the voltage measuring module 14 electrically connecting to the middle points of the bridge arms 12A, 12B, 12C.

In Step 405, the open-circuit detection module 16 accesses the voltage differences of each two bridge arms by the voltage measuring module 14, to compare the voltage differences with the reference value for generating a comparison result accordingly, and determines the operation states of the upper and lower bridge arms 120-125 of the bridge arms 12A, 12B, 12C. In an exemplary embodiment, the open-circuit detection module 16 establishes failure switch tables according to the determined operation states.

In Step 406, the open-circuit detection module 18 executes summarization and analysis to the failure results, to compare the operation states determined by different testing impulse signals, to further determine if each of the upper and lower bridge arms 120-125 is actually open circuit.

In Step 407, the open-circuit detection flow ends.

Figure 5:
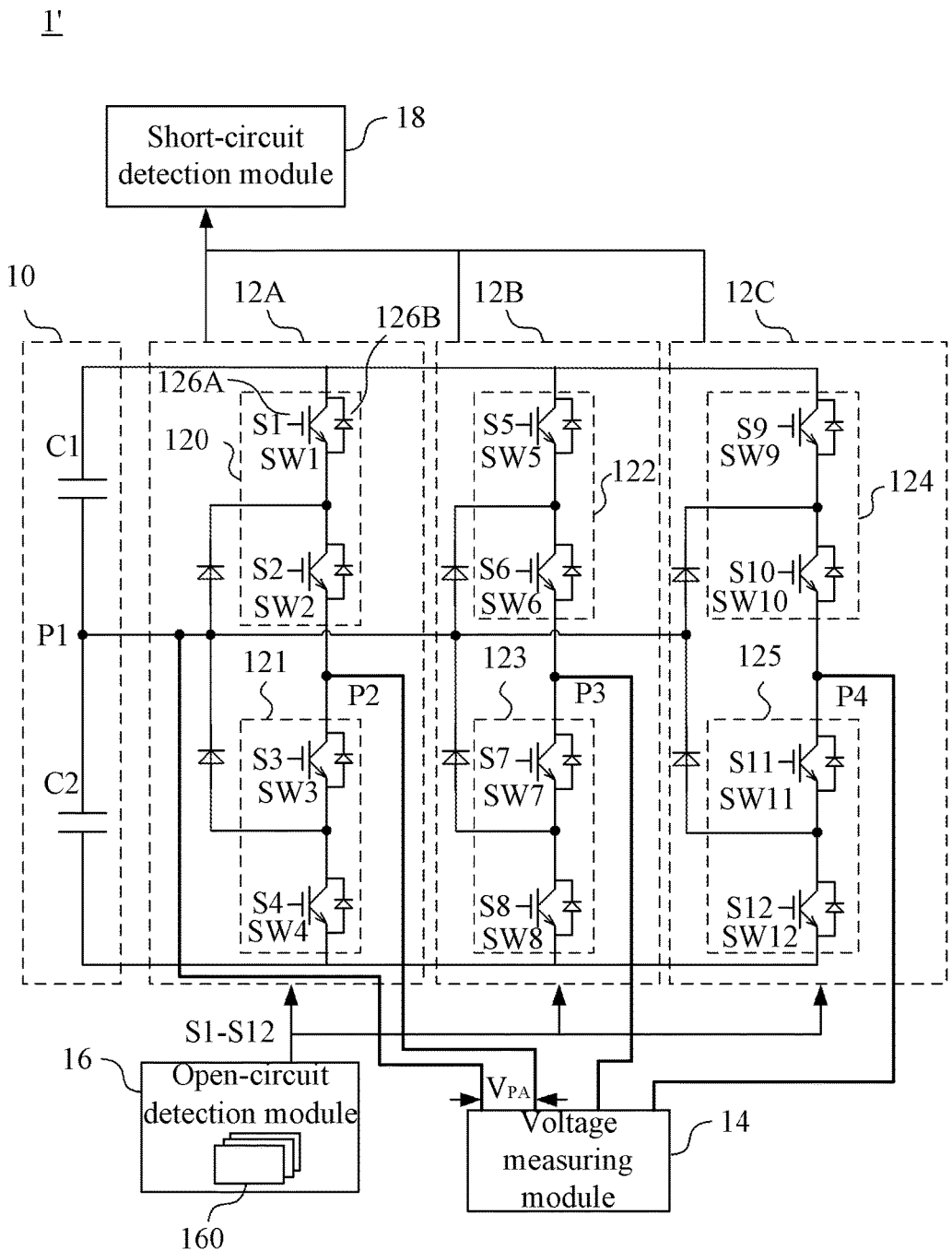
FIG. 5 is a circuit diagram of a converter circuit according to an exemplary embodiment of the present disclosure.

Please refer to FIG. 5. FIG. 5 is a circuit diagram of a converter circuit 1' according to an exemplary embodiment of the present disclosure. Like the converter circuit 1 in FIG. 1, the converter circuit 1' in FIG. 5 includes a capacitor module 10, bridge arms 12A, 12B, 12C, a voltage measuring module 14 and an open-circuit detection module 16. The difference comparing to FIG. 1 is that, the voltage measuring module 14 in this exemplary embodiment further electrically connects to a middle point P1 between the first capacitor C1 and the second capacitor C2, to measure the voltage differences between the capacitor module 10 and one of the bridge arms 12A, 12B, and 12C.

The open-circuit detection module 16 transmits the testing impulse signals S1-S12, and processes the measurements of the voltage differences by the voltage measuring module 14, the open-circuit detection module 16 accesses the voltage differences and compares with the reference value to generate a comparison result accordingly, to further determine the operation states of the upper bridge arm or the lower bridge arm of the bridge arms to be detected, the operation states are the normal states or the open-circuit state.

For example, when the testing impulse signals S1-S4 are (1, 1, 0, 0), the bridge arms 12A is used as the upper-conducted bridge arm. The testing impulse signals S1-S2 will make the upper bridge arm 120 including the upper-half power semiconductor switches SW1-SW2 conducted under the normal operation. And the testing impulse signals S3-S4 make the lower bridge arm 121 having the lower-half power semiconductor switches SW3-SW4 off under the normal operation. At this time, the combination (1, 1, 0, 0) of the testing impulse signals S1-S4 can be shorted as 1. When the testing impulse signals S1-S4 are (0, 0, 1, 1), the bridge arms 12A is used as the lower-conducted arm. The testing impulse signals S3-S4 will make the lower bridge arm 121 having the lower-half power semiconductor switches SW3-SW4 conducted under the normal operation. And the testing impulse signals S1-S2 make the upper bridge arm 120 having the upper-half power semiconductor switches SW1-SW2 off under the normal operation. At the moment, the combination (0, 0, 1, 1) of the testing impulse signals S1-S4 can be shorted as +1. And when both the testing impulse signals S5-S8 and S9-S12 are (0, 0, 0, 0), respectively, both the bridge arms 12B and 12C are used as the off bridge arms. At this time, the combination (0, 0, 0, 0) of the testing impulse signals S5-S8 and S9-S12 can be shorted as 0.

After the open-circuit detection module 16 transmits the testing impulse signals S1-S12 (1, 0, 0), the voltage measuring module 14 measures the voltage difference $V_{P4}$ between the capacitor module 10 and the bridge arm 12A. When the voltage difference $V_{P4}$ is equal to the reference value, it means the upper bridge arm 120 is under normal operation, wherein the reference value is the cross voltage between two terminals of the capacitor C1 multiplied by a coefficient. And when the voltage difference $V_{P4}$ is not equal to the reference value, it means the upper bridge arm 120 is under open-circuit state.

Likewise, besides the set (1, 0, 0), the open-circuit detection module 16 may transmits five sets (−1, 0, 0), (0, 1, 0), (0, −1, 0), (0, 0, 1), (0, 0, −1) of the testing impulse signals S1-S12 to measure the upper and lower half-bridges of the bridge arms, to achieve the purpose of determining the open-circuit conditions of the upper and lower half-bridges of the bridge arms. Since the operations and steps are similar to that of the set of (1, 0, 0), further description is omit here for the sake of brevity.

Figure 6:
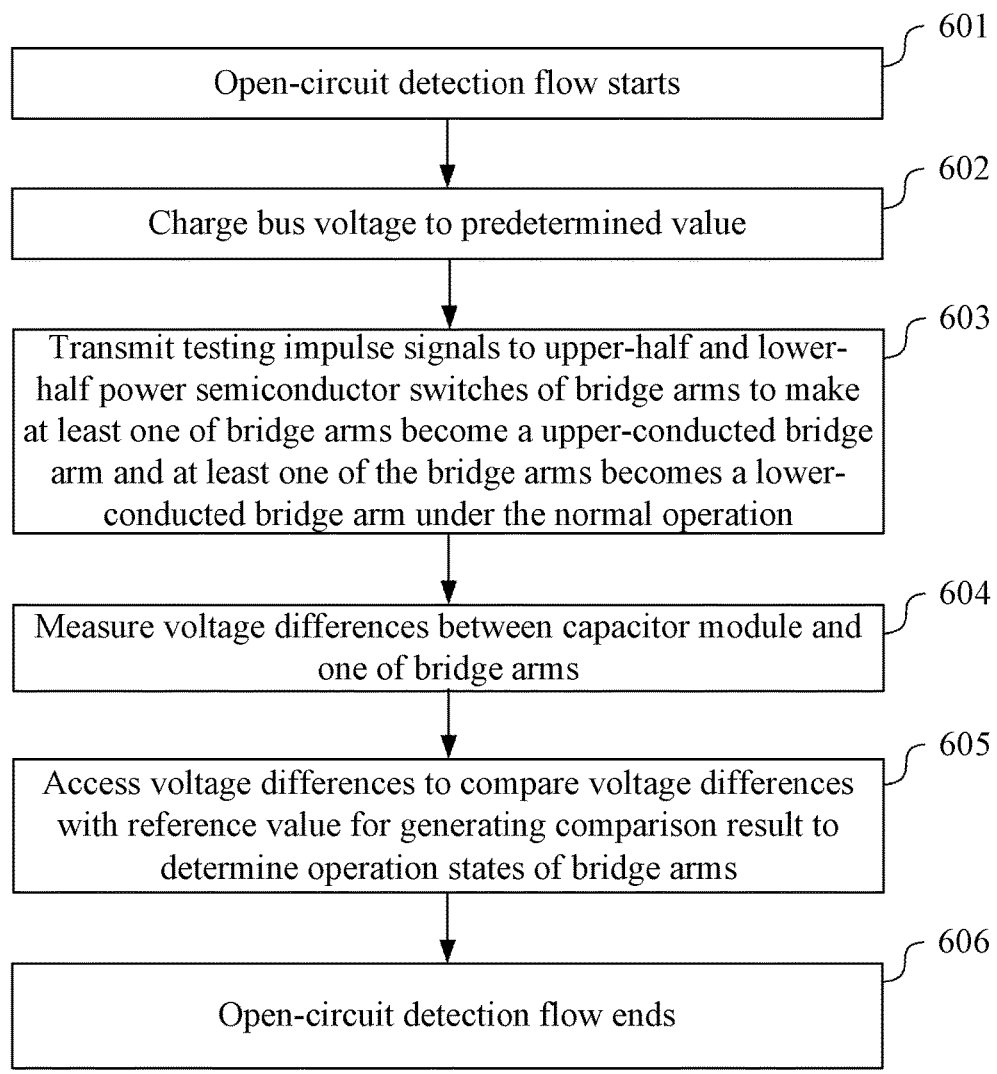
FIG. 6 is a flowchart of an open-circuit detection method of the converter circuit according to an exemplary embodiment of the present disclosure.

Please refer to FIG. 6. FIG. 6 is a flowchart of an open-circuit detection method 600 of the converter circuit according to an exemplary embodiment of the present disclosure. The open-circuit detection method 400 of the converter circuit can be applied to the converter circuit 1' illustrated in FIG. 5. The open-circuit detection method 400 of the converter circuit includes the following steps. (Please notes that the order of the steps disclosed in this exemplary embodiment can vary, or some or all the steps can be executed at the same time, according to the actual requirements.)

In Step 601, the open-circuit detection flow starts.

In Step 602, make the bus voltage charges to the predetermined value, that is, make the cross voltage of the capacitor module equal to Vdc.

In Step 603, the open-circuit detection module 16 transmit the testing impulse signals S1-S12 to the upper-half and lower-half power semiconductor switches SW1-SW12 of the bridge arms 12A, 12B, 12C, to make at least one of the bridge arms 12A, 12B, 12C become a upper-conducted bridge arm which is the bridge arm only has a conducted upper bridge arm under the normal operation, or at least one of the bridge arms becomes a lower-conducted bridge arm which is the bridge arm only has a conducted lower bridge arm under the normal operation.

In Step 604, measure the voltage differences between the capacitor module 10 and one of the bridge arms by the voltage measuring module 14 electrically connecting to the capacitor middle point P1 and the middle points of the bridge arms 12A, 12B, 12C.

In Step 605, the open-circuit detection module 16 accesses the voltage differences between the upper-conducted bridge arm or the lower-conducted arm and the capacitor module 10 by the voltage measuring module 14, to compare the voltage differences with the reference value for generating a comparison result accordingly, and determines the operation states of the upper or lower bridge arms of the bridge arms.

In Step 606, the open-circuit detection flow ends.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A converter circuit, comprising:
   a capacitor module;
   a plurality of bridge arms, each of the bridge arms electrically connects to the capacitor module in parallel and respectively comprises an upper bridge arm having at least one upper-haft power semiconductor switch and a lower bridge arm having at least one lower-half semiconductor switch, wherein the upper bridge arm and the lower bridge arm electrically connect in series at a middle point;
   a voltage measuring module, for electrically connecting to the middle points of the bridge arms, to measure each voltage difference between each two bridge arms; and
   an open-circuit detection module, for transmitting a plurality set of testing impulse signals to the upper-half power semiconductor switches and the lower-half power semiconductor switches of the bridge arms, to make at least one of the bridge arms become a upper-conducted bridge arm which is the bridge arm only with a conducted upper bridge arm under a normal operation and at least one of the bridge arms become a lower-conducted bridge arm which is the bridge arm only with a conducted lower bridge arm under the normal operation;
   wherein the open-circuit detection module gets the voltage differences of each pair of the upper-conducted and lower-conducted bridge arms from the voltage measuring module, to make comparison with a reference value for generating a comparison result accordingly, and to each pair of the upper-conducted and lower-conducted bridge arms, to further determine operation states of the ought-to-be conducted upper bridge arm and of the ought-to-be conducted lower bridge arm under the normal operation;
   the open-circuit detection module further makes comparisons between the operation states determined according to the different sets of the testing impulse signals, to further determine if the upper and lower bridge arms of the bridge arms are actually open circuit.

2. The converter circuit of claim 1, wherein the open-circuit detection module generate the reference value according to a cross voltage value of the capacitor module.

3. The converter circuit of claim 1, wherein the open-circuit detection module stores a plurality of failure switch tables, respectively records the operation states determined according to the plurality sets of testing impulse signals, wherein the operation states comprises at least a normal state, an open-circuit failure state and a potential open-circuit failure state.

4. The converter circuit of claim 3, wherein the bridge arms comprise a first bridge arm, a second bridge arm and a third bridge arm, in which the first bridge arm is the upper-conducted bridge arm, the second bridge arm and the third bridge arm are the lower-conducted arms, respectively, the open-circuit detection module gets a first voltage difference between the first bridge arm and the second bridge arm and a second voltage difference between the first bridge arm and the third bridge arm from the voltage measuring module;

wherein when both the first voltage difference and the second voltage difference are equal to the reference value, and the open-circuit detection module determines the operation state of each of the upper bridge arm of the first bridge arm, the lower bridge arm of the second bridge arm, and the lower bridge arm of the third bridge arm is the normal state;

when the first voltage difference is equal to the reference value and the second voltage difference is different from the reference value, the open-circuit detection module determines that the operation state of each of the upper bridge arm of the first bridge arm and the lower bridge arm of the second bridge arm is the normal state, and the operation state of the lower bridge arm of the third bridge arm is the open-circuit failure state;

when the first voltage difference is different from the reference value and the second voltage difference is equal to the reference value, the open-circuit detection module determines that the operation states of each of the upper bridge arm of the first bridge arm and the lower bridge arm of the third bridge arm are the normal state, and the operation state of the lower bridge arm of the second bridge arm is the open-circuit failure state; and when the first voltage difference is different from the reference value and the second voltage difference is different from the reference value, the open-circuit detection module determines that the operation states of each of the upper bridge arm of the first bridge arm, the lower bridge arm of the second bridge arm, and the lower bridge arm of the third bridge arm are the potential open-circuit failure state.

5. The converter circuit of claim 3, wherein the bridge arms comprise a first bridge arm, a second bridge arm and a third bridge arm, wherein the first bridge arm is the lower-conducted arm, the second bridge arm and the third bridge arm are the upper-conducted bridge arm, respectively, the open-circuit detection module gets a first voltage difference between the first bridge arm and the second bridge arm and a second voltage difference between the first bridge arm and the third bridge arm from the voltage measuring module;

wherein when both the first voltage difference and the second voltage difference are equal to the reference value, the open-circuit detection module determines the operation state of each of the lower bridge arm of the first bridge arm, the upper bridge arm of the second bridge arm, and the upper bridge arm of the third bridge arm is the normal state;

when the first voltage difference is equal to the reference value and the second voltage difference is different from the reference value, the open-circuit detection module determines that the operation state of each of the lower bridge arm of the first bridge arm and the upper bridge arm of the second bridge arm is the normal state, and the operation state of the upper bridge arm of the third bridge arm is the open-circuit failure state;

when the first voltage difference is different from the reference value and the second voltage difference is equal to the reference value, the open-circuit detection module determines that the operation state of each of the lower bridge arm of the first bridge arm and the upper bridge arm of the third bridge arm is the normal state, and the operation state of the upper bridge arm of the second bridge arm is the open-circuit failure state; and when the first voltage difference is different from the reference value and the second voltage difference is different from the reference value, the open-circuit detection module determines that the operation state of each of the lower bridge arm of the first bridge arm, the upper bridge arm of the second bridge arm, and the upper bridge arm of the third bridge arm is the potential open-circuit failure state.

6. The converter circuit of claim 3, wherein when the operation state of the upper bridge arm of one of the bridge arms in any one of the failure switch tables is the open-circuit failure state, the open-circuit detection module determines the upper bridge arm is actually open circuit; and when the operation state of the lower bridge arm of one of the bridge arms in any one of the failure switch tables is the open-circuit failure state, the open-circuit detection module determines the lower bridge arm is actually open circuit.

7. The converter circuit of claim 3, wherein when the operation state of the upper bridge arm of one of the bridge arms in any one of the failure switch tables is not the open-circuit failure state, and in at least one of the failure switch tables is the normal state, the open-circuit detection module determines the upper bridge arm is actually normal; and when the operation state of the lower bridge arm of one of the bridge arms in any one of the failure switch tables is not the open-circuit failure state, and in at least one of the failure switch tables is the normal state, the open-circuit detection module determines the lower bridge arm is actually normal.

8. The converter circuit of claim 3, further comprising a short-circuit detection module, wherein when the operation state of the upper bridge arm of one of the bridge arms in all of the failure switch tables is the potential open-circuit failure state, the open-circuit detection module transmits a conducting impulse signal to the upper bridge arm and the corresponding lower bridge arm, to make the short-circuit detection module detect the upper bridge arm and the lower bridge arm;

when the short-circuit detection module detects the upper bridge arm and the lower bridge arm are under the short-circuit failure, the open-circuit detection module determines the upper bridge arm is actually normal; and when the short-circuit detection module does not detect the upper bridge arm and the lower bridge arm as the short-circuit failure, the open-circuit detection module determines the upper bridge arm is actually open circuit.

9. The converter circuit of claim 3, further comprising a short-circuit detection module, wherein when the operation state of the lower bridge arm of one of the bridge arms in all of the failure switch tables is the potential open-circuit failure state, the open-circuit detection module transmits a conducting impulse signal to the lower bridge arm and the corresponding upper bridge arm, to make the short-circuit detection module detect the upper bridge arm and the lower bridge arm;

when the short-circuit detection module detects the upper bridge arm and the lower bridge arm are under the short-circuit failure, the open-circuit detection module determines the lower bridge arm is actually normal; and when the short-circuit detection module does not detect the upper bridge arm and the lower bridge arm as the short-circuit failure, the open-circuit detection module determines lower bridge arm is actually open circuit.

10. The converter circuit of claim 1, wherein when the upper bridge arm or the lower bridge arm is actually open circuit, it is caused by the open circuit of the upper-half power semiconductor switch or of the lower-half power semiconductor switch.

11. The converter circuit of claim 1, wherein the upper-half power semiconductor switch and the lower-half power semiconductor switch further comprise an Insulated Gate Bipolar Transistor (IGBT), respectively, and the plurality sets of the testing impulse signals are used for transmitting to a gate of the IGBT.

12. The converter circuit of claim 1, wherein the converter circuit is a three-level converter circuit, the number of the upper-half power semiconductor switches of each of the bridge arms is 2, and the number of the lower-half power semiconductor switches of each of the bridge arms is 2.

13. An open-circuit detection method of a converter circuit, for testing if a converter circuit having an open-circuit condition, wherein the converter circuit comprises a capacitor module, a plurality of bridge arms, a voltage measuring module, and an open-circuit detection module, each of the bridge arms electrically connects to the capacitor module in parallel and respectively comprises an upper bridge arm having at least one upper-half power semiconductor switch and a lower bridge arm having at least one lower-half semiconductor switch, wherein the upper bridge arm and the lower bridge arm electrically connect in series at a middle point; the open-circuit detection method of the converter circuit comprises:

transmitting a plurality sets of testing impulse signals to the upper-half power semiconductor switches and the lower-half power semiconductor switches of the bridge arms, to make at least one of the bridge arms become a upper-conducted bridge arm which is the only bridge arm with a conducted upper bridge arm under a normal operation and at least one of the bridge arms become a lower-conducted bridge arm which is the only bridge arm with a conducted lower bridge arm under the normal operation;

measuring each voltage difference between each two bridge arms by the voltage measuring module electrically connecting to the middle points of the bridge arms;

getting the voltage differences of each pair of the upper-conducted and lower-conducted bridge arms from the voltage measuring module by the open-circuit detection module, to make comparison with a reference value for generating a comparison result accordingly, and to each pair of the upper-conducted and lower-conducted arms, to further determine operation states of the ought-to-be conducted upper bridge arm and of the ought-to-be conducted lower bridge arm under the normal operation; and making comparisons between the operation states determined according to the different sets of the testing impulse signals by the open-circuit detection module, to further determine if the upper and lower bridge arms of each of the bridge arms are actually open circuit.

14. The open-circuit detection method of claim 13, further comprising:

generating the reference value according to a cross voltage value of the capacitor module by the open-circuit detection module.

15. The open-circuit detection method of claim 13, further comprising:

respectively recording the operation states determined according to the plurality sets of testing impulse signals stored into one of a plurality of failure switch tables by the open-circuit detection module, wherein the operation states comprises at least a normal state, an open-circuit failure state and a potential open-circuit failure state.

16. The open-circuit detection method of claim 15, wherein the bridge arms comprise a first bridge arm, a second bridge arm and a third bridge arm, in which the first bridge arm is the upper-conducted bridge arm, the second bridge arm and the third bridge arm are the lower-conducted arms, respectively, and the open-circuit detection method of the converter circuit further comprises:

getting a first voltage difference between the first bridge arm and the second bridge arm and a second voltage difference between the first bridge arm and the third bridge arm from the voltage measuring module by the open-circuit detection module;

wherein when both the first voltage difference and the second voltage difference are equal to the reference value, and the open-circuit detection module determines the operation state of each of the upper bridge arm of the first bridge arm, the lower bridge arm of the second bridge arm, and the lower bridge arm of the third bridge arm is the normal state;

when the first voltage difference is equal to the reference value and the second voltage difference is different from the reference value, the open-circuit detection module determines that the operation state of each of the upper bridge arm of the first bridge arm and the lower bridge arm of the second bridge arm is the normal state, and the operation state of the lower bridge arm of the third bridge arm is the open-circuit failure state;

when the first voltage difference is different from the reference value and the second voltage difference is equal to the reference value, the open-circuit detection module determines that the operation state of each of the upper bridge arm of the first bridge arm and the lower bridge arm of the third bridge arm is the normal state, and the operation state of the lower bridge arm of the second bridge arm is the open-circuit failure state; and when the first voltage difference is different from the reference value and the second voltage difference is different from the reference value, the open-circuit detection module determines that the operation state of each of the upper bridge arm of the first bridge arm, the lower bridge arm of the second bridge arm, and the lower bridge arm of the third bridge arm is the potential open-circuit failure state.

17. The open-circuit detection method of claim 15, wherein the bridge arms comprise a first bridge arm, a second bridge arm and a third bridge arm, wherein the first bridge arm is the lower-conducted arm, the second bridge arm and the third bridge arm are the upper-conducted bridge arm, respectively, and the open-circuit detection method of the converter circuit further comprises:

getting a first voltage difference between the first bridge arm and the second bridge arm and a second voltage difference between the first bridge arm and the third bridge arm from the voltage measuring module by the open-circuit detection module;

wherein when both the first voltage difference and the second voltage difference are equal to the reference value, the open-circuit detection module determines the operation state of each of the lower bridge arm of the first bridge arm, the upper bridge arm of the second bridge arm, and the upper bridge arm of the third bridge arm is the normal state;

when the first voltage difference is equal to the reference value and the second voltage difference is different from the reference value, the open-circuit detection module determines that the operation states of each of the lower bridge arm of the first bridge arm and the upper bridge arm of the second bridge arm is the normal state, and the operation state of the upper bridge arm of the third bridge arm is the open-circuit failure state;

when the first voltage difference is different from the reference value and the second voltage difference is equal to the reference value, the open-circuit detection module determines that the operation state of each of the lower bridge arm of the first bridge arm and the upper bridge arm of the third bridge arm is the normal state, and the operation state of the upper bridge arm of the second bridge arm is the open-circuit failure state; and when the first voltage difference is different from the reference value and the second voltage difference is different from the reference value, the open-circuit detection module determines that the operation state of each of the lower bridge arm of the first bridge arm, the upper bridge arm of the second bridge arm, and the upper bridge arm of the third bridge arm is the potential open-circuit failure state.

18. The open-circuit detection method of claim 15, further comprising:

wherein when the operation state of the upper bridge arm of one of the bridge arms in any one of the failure switch tables is the open-circuit failure state, the open-circuit detection module determines the upper bridge arm is actually open circuit; and when the operation state of the lower bridge arm of one of the bridge arms in any one of the failure switch tables is the open-circuit failure state, the open-circuit detection module determines the lower bridge arm is actually open circuit.

19. The open-circuit detection method of claim 15, further comprising: when the operation state of the upper bridge arm of one of the bridge arms in any one of the failure switch tables is not the open-circuit failure state, and in at least one of the failure switch tables is the normal state, the open-circuit detection module determines the upper bridge arm is actually normal; and when the operation state of the lower bridge arm of one of the bridge arms in any one of the failure switch tables is not the open-circuit failure state, and in at least one of the failure switch tables is the normal state, the open-circuit detection module determines the lower bridge arm is actually normal.

20. The open-circuit detection method of claim 15, wherein the converter circuit further comprises a short-circuit detection module, when the operation state of the upper bridge arm of one of the bridge arms in all of the failure switch tables is the potential open-circuit failure state, the open-circuit detection method of the converter circuit further comprises:

transmitting a conducting impulse signal to the upper bridge arm and the corresponding lower bridge arm by the open-circuit detection module, to make the short-circuit detection module detect the upper bridge arm and the lower bridge arm;

when the short-circuit detection module detects the upper bridge arm and the lower bridge arm are under the short-circuit failure, the open-circuit detection module determines the upper bridge arm is actually normal; and when the short-circuit detection module does not detect the upper bridge arm and the lower bridge arm as the short-circuit failure, the open-circuit detection module determines the upper bridge arm is actually open circuit.

21. The open-circuit detection method of claim 15, wherein the converter circuit further comprises a short-circuit detection module, when the operation states of the lower bridge arm of one of the bridge arms in all of the failure switch tables are the potential open-circuit failure state, the open-circuit detection method of the converter circuit further comprises:

transmitting a conducting impulse signal to the lower bridge arm and the corresponding upper bridge arm by the open-circuit detection module, to make the short-circuit detection module detect the upper bridge arm and the lower bridge arm;

when the short-circuit detection module detects the upper bridge arm and the lower bridge arm are under the short-circuit failure, the open-circuit detection module determines the lower bridge arm is actually normal; and when the short-circuit detection module does not detect the upper bridge arm and the lower bridge arm as the short-circuit failure, the open-circuit detection module determines lower bridge arm is actually open circuit.

22. The open-circuit detection method of claim 13, wherein when the upper bridge arm or the lower bridge arm is actually open circuit, it is caused by the open circuit of the upper-half power semiconductor switch or of the lower-half power semiconductor switch.

23. A converter circuit, comprising:

a capacitor module, having a capacitive upper bridge arm with at least a first capacitor and a capacitive lower bridge arm with at least a second capacitor, wherein the capacitive upper bridge arm and the capacitive lower bridge arm electrically connect at a capacitive middle point;

a plurality of bridge arms, each of the bridge arms electrically connects to the capacitor module in parallel and comprises a upper bridge arm having at least one upper-half power semiconductor switch and a lower bridge arm having at least one lower-half semiconductor switch, respectively, wherein the upper bridge arm and the lower bridge arm electrically connect in series at a middle point;

a voltage measuring module, for electrically connecting to the middle points of the bridge arms and the capacitive middle point, to measure voltage differences between the capacitor module and one of the bridge arms; and an open-circuit detection module, for transmitting a plurality set of testing impulse signals to the upper-half power semiconductor switches and the lower-half power semiconductor switches of the bridge arms, to make at least one of the bridge arms become a upper-conducted bridge arm which is the bridge arm only with a conducted upper bridge arm under a normal operation or to make at least one of the bridge arms become a lower-conducted bridge arm which is the bridge arm only with a conducted lower bridge arm under the normal operation;

wherein the open-circuit detection module gets the voltage difference between the capacitor module and the upper-conducted bridge arm or the voltage difference between the capacitor module and the lower-conducted arm from the voltage measuring module, to make comparison with a reference value for generating a comparison result accordingly, and to the upper-conducted bridge arm or to the lower-conducted arm, to further determine an operation state of the ought-to-be conducted upper bridge arm or of the ought-to-be conducted lower bridge arm under the normal operation.

24. The converter circuit of claim 23, wherein the bridge arms comprise a first bridge arm, and the first bridge arm is the upper-conducted bridge arm, the open-circuit detection module gets the voltage difference between the first bridge arm and the capacitor module from the voltage measuring module;

wherein when the voltage difference is equal to the reference value, the open-circuit detection module determines the operation state of the upper bridge arm of the first bridge arm is a normal state; and when the voltage difference is different from the reference value, the open-circuit detection module determines the operation state of the upper bridge arm of the first bridge arm is an open-circuit state.

25. The converter circuit of claim 23, wherein the bridge arms comprise a first bridge arm, and the first bridge arm is the first bridge arm is the lower-conducted arm, the open-circuit detection module gets the voltage difference between the first bridge arm and the capacitor module from the voltage measuring module;

wherein when the voltage difference is equal to the reference value, the open-circuit detection module determines the operation state of the lower bridge arm of the first bridge arm is a normal state;

when the voltage difference is different from the reference value, the open-circuit detection module determines the operation state of the lower bridge arm of the first bridge arm is an open-circuit state.

26. An open-circuit detection method of a converter circuit, for testing if a converter circuit having an open-circuit condition, wherein the converter circuit comprises a capacitor module, a plurality of bridge arms, a voltage measuring module, and an open-circuit detection module, the capacitor module has a capacitive upper bridge arm with at least a first capacitor and a capacitive lower bridge arm with at least a second capacitor, wherein the capacitive upper bridge arm and the capacitive lower bridge arm electrically connect at a capacitive middle point; the bridge arms, each of the bridge arms electrically connects to the capacitor module in parallel and comprises a upper bridge arm having at least one upper-half power semiconductor switch and a lower bridge arm having at least one lower-half semiconductor switch, respectively, wherein the upper bridge arm and the lower bridge arm electrically connect in series at a middle point; the open-circuit detection method of the converter circuit further comprises:

transmitting a plurality sets of testing impulse signals to the upper-half power semiconductor switches and the lower-half power semiconductor switches of the bridge arms, to make one of the bridge arms become a upper-conducted bridge arm which is the only bridge arm with a conducted upper bridge arm under a normal operation, or to make one of the bridge arms become a lower-conducted bridge arm which is the only bridge arm with a conducted lower bridge arm under the normal operation;

measuring voltage differences between the capacitor module and one of the bridge arms by the voltage measuring module electrically connecting to the capacitive middle point and the middle points of the bridge arms; and getting the voltage difference between the capacitor module and the upper-conducted bridge arm or the voltage difference between the capacitor module and the lower-conducted arm from the voltage measuring module by the open-circuit detection module, to make comparison with a reference value for generating a comparison result accordingly, and to the upper-conducted bridge arm or to the lower-conducted arm, to further determine an operation state of the ought-to-be conducted upper bridge arm or of the ought-to-be conducted lower bridge arm under the normal operation.

27. The open-circuit detection method of claim 26, wherein the bridge arms comprise a first bridge arm, and the first bridge arm is the upper-conducted bridge arm, the open-circuit detection method of the converter circuit further comprises:

getting the voltage difference between the first bridge arm and the capacitor module from the voltage measuring module by the open-circuit detection module;

wherein when the voltage difference is equal to the reference value, the open-circuit detection module determines the operation state of the upper bridge arm of the first bridge arm is a normal state; and when the voltage difference is different from the reference value, the open-circuit detection module determines the operation state of the upper bridge arm of the first bridge arm is an open-circuit state.

28. The open-circuit detection method of claim 26, wherein the bridge arms comprise a first bridge arm, and the first bridge arm is the lower-conducted arm, the open-circuit detection method of the converter circuit further comprises:

getting the voltage difference between the first bridge arm and the capacitor module from the voltage measuring module by the open-circuit detection module;

wherein when the voltage difference is equal to the reference value, the open-circuit detection module determines the operation state of the lower bridge arm of the first bridge arm is a normal state;

when the voltage difference is different from the reference value, the open-circuit detection module determines the operation state of the lower bridge arm of the first bridge arm is an open-circuit state.

* * * * *